(12) United States Patent
Choi et al.

(10) Patent No.: US 10,528,643 B1
(45) Date of Patent: Jan. 7, 2020

(54) VECTOR-MATRIX MULTIPLICATION USING NON-VOLATILE MEMORY CELLS

(71) Applicant: SanDisk Technologies LLC, Addison, TX (US)

(72) Inventors: Won Ho Choi, San Jose, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/052,420

(22) Filed: Aug. 1, 2018

(51) Int. Cl.
  G06F 17/16 (2006.01)
  G06F 7/523 (2006.01)
  G11C 11/4094 (2006.01)
  G06N 3/063 (2006.01)
  G11C 11/16 (2006.01)

(52) U.S. Cl.
  CPC .............. *G06F 17/16* (2013.01); *G06F 7/523* (2013.01); *G06N 3/0635* (2013.01); *G11C 11/4094* (2013.01); *G06F 2212/2022* (2013.01); *G11C 11/161* (2013.01)

(58) Field of Classification Search
  CPC .................................. G06F 7/523; G06F 17/16
  See application file for complete search history.

(56) References Cited

U.S. PATENT DOCUMENTS

| 2011/0119215 | A1 | 5/2011 | Elmegreen et al. | |
| 2018/0004708 | A1* | 1/2018 | Muralimanohar | G06F 17/16 |
| 2018/0046598 | A1* | 2/2018 | Le Gallo | G06F 17/16 |
| 2019/0034201 | A1* | 1/2019 | Muralimanohar | G06F 9/3001 |
| 2019/0205729 | A1* | 7/2019 | Tran | G06N 3/04 |
| 2019/0205741 | A1* | 7/2019 | Gupta | G06F 15/00 |

FOREIGN PATENT DOCUMENTS

GB 2552014 A 10/2018

OTHER PUBLICATIONS

Agarwal, Sapan, et al., "Achieving Ideal Accuracies in Analog Neuromorphic Computing Using Periodic Carry," IEEE, Symposium on VLSI Technology, Jun. 2017, 2 pages.

(Continued)

*Primary Examiner* — Chuong D Ngo
(74) *Attorney, Agent, or Firm* — Vierra Magen Marcus LLP

(57) ABSTRACT

Technology is described herein for performing multiplication using non-volatile memory cells. A multiplicand may be stored a node that includes multiple non-volatile memory cells. Each memory cell in a node may be programmed to one of two physical states, with each non-volatile memory cell storing a different bit of the multiplicand. Multiplication may be performed by applying a multiply voltage to the node of memory cells and processing memory cell currents from the memory cells in the node. The memory cell current from each memory cell in the node is multiplied by a different power of two. The multiplied signals are summed to generate a "result signal,' which represents a product of the multiplier and a multiplicand stored in the node. If desired, "binary memory cells" may be used to perform multiplication. Vector/vector and vector/matrix multiplication may also be performed.

20 Claims, 13 Drawing Sheets

(56) References Cited

OTHER PUBLICATIONS

Garland et al., "Low Complexity Multiply Accumulate Unit for Weight-Sharing Convolutional Neural Networks", arXiv: 1609.05132v4 [cs.NE], Jan. 19, 2017, 4 pages.

Gong et al., "Signal and noise extraction from analog memory elements for neuromorphic computing", Nature Communications, Article DOI: 10.1038/s41467-018-04486-1, 2018, 8 pages.

Obradovic et al., "A Multi-Bit Neuromorphic Weight Cell Using Ferroelectric FETs, suitable for SoC Integration", Journal of the Electron Devices Society, 2018, vol. 8, 11 pages.

Prezioso, et al., "Training and Operation of an Integrated Neuromorphic Network Base on Metal-Oxide Memristors", Dec. 2014, 21 pages.

\* cited by examiner

VECTOR-MATRIX MULTIPLICATION USING NON-VOLATILE MEMORY CELLS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include, but are not limited to, magnetoresistive memory (e.g., MRAM), phase change memory (e.g., PCM) ferroelectric field effect transistor (FeFET) memory, ferroelectric memory (e.g., FeRAM), and flash memory (e.g., NAND-type and NOR-type flash memory).

DETAILED DESCRIPTION

Figure 1A:
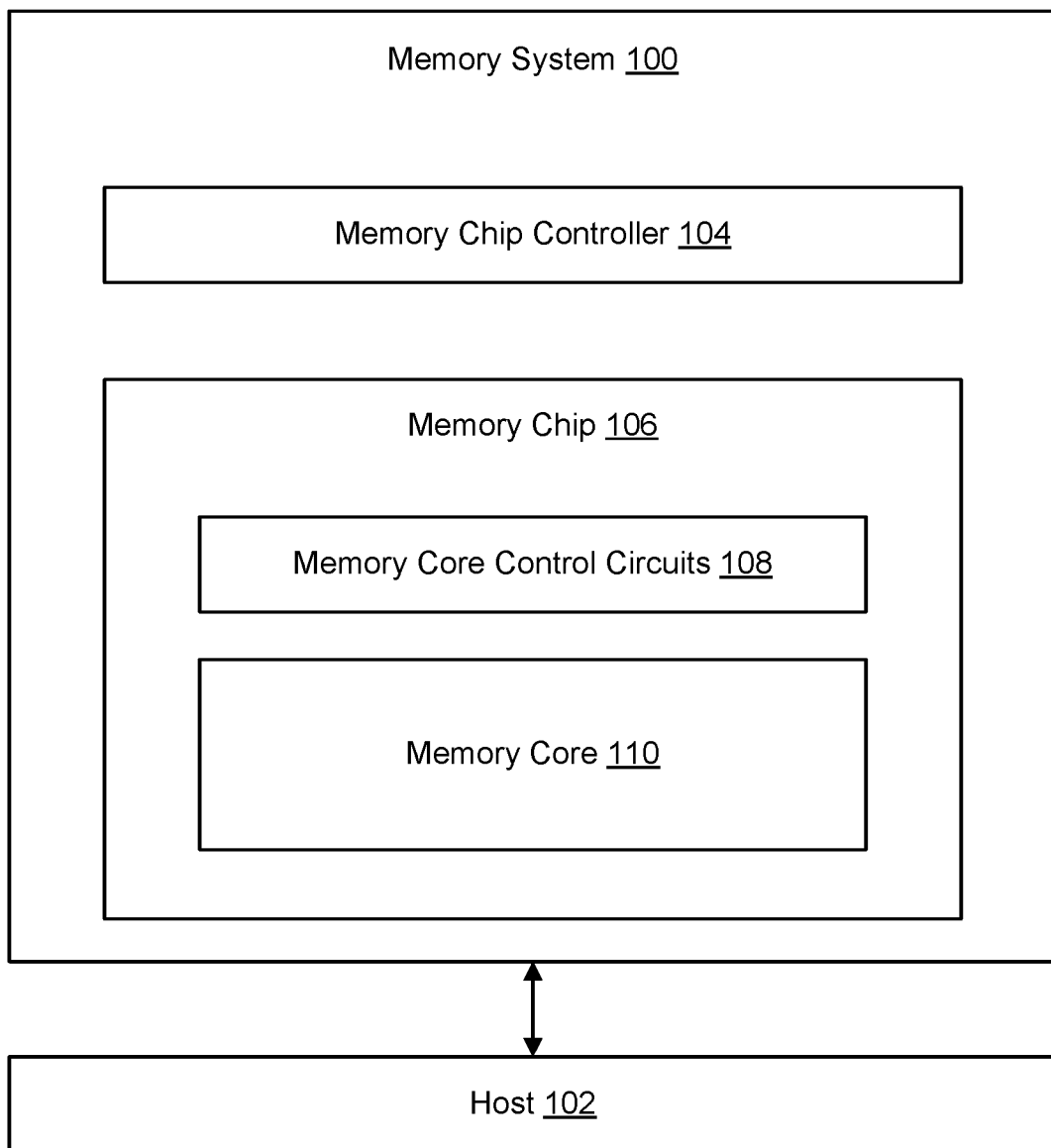
FIG. 1A depicts an embodiment of a memory system and a host.

Technology is described herein for performing multiplication using non-volatile memory cells. In one embodiment, vector/vector multiplication (e.g., vector dot product) is performed in a non-volatile memory system. A vector dot product is the summation of the products of the corresponding elements of two equal length vectors (where equal length refers to an equal number of elements). Hence, a vector dot product may also be referred to as a "multiply and accumulate" (MAC). In one embodiment, vector/matrix multiplication is performed in a non-volatile memory system. In one embodiment, non-volatile memory cells are used to perform multiplication in a neuromorphic computing system. A neuromorphic computing system may be used to implement an artificial neural network.

In one embodiment, a multiplicand is stored in a node that includes multiple non-volatile memory cells. In some embodiments, each memory cell in the node is programmed to one of two physical states. Herein, a "physical state" may be referred to more briefly as a "state." For the sake of discussion, one state may be referred to as an "on-state" and the other state as an "off-state." The on-state in a "high current state," whereas the off-state is a "low current state," in one embodiment. One state may be used to store a "1" and the other to store a "0." Thus, it may be stated that each memory cell stores one bit of information, in one embodiment. In one embodiment, each non-volatile memory cell stores a different digit of the multiplicand in a binary number system. A digit in a binary number system is typically referred to as a bit ("binary digit"). Each memory cell may store a bit for one position in the binary number system. For example, one memory cell stores a bit for the "1s" position, another memory cell stores a bit for the "2s" position, and still another memory cell stores a bit for the "4s" position. Thus, the memory cells in the node may collectively store three bits of information, in one embodiment. In general, there are two or more memory cell per node.

In one embodiment, the memory cells in the nodes are "binary non-volatile memory cells." A "binary non-volatile memory cell," as the term is defined herein, is a non-volatile memory cell that can be repeatedly switched between only two physical states. This is in contrast to a "multi-state non-volatile memory cell" which, as the term is defined herein, may be repeatedly switched between more than two physical states. Some types of non-volatile memory cells are well-suited for use as binary non-volatile memory cells, although they may not be well-suited for use as multi-state non-volatile memory cells. For example, some memory cells having a ferroelectric field effect transistor (FeFET) are well-suited for use as binary non-volatile memory cells. Also, some magnetoresistive memory (e.g., MRAM) is well-suited for use as binary non-volatile memory cells. However, some FeFETs and MRAM are not well-suitable for use as multi-state non-volatile memory cells.

Multiplication may be performed by applying a multiply voltage to the node of memory cells and processing memory cell currents from the memory cells in the node. The magnitude of the multiply voltage represents a multiplier, in one embodiment. In one embodiment, each memory cell in the node has at least two terminals, such that the multiply voltage may be applied to each memory cell by applying the multiply voltage across two terminals of each memory cells. Each memory cell in the node responds to the multiply voltage by passing a memory cell current, in one embodiment. Each memory cell in the node responds to the multiply voltage by causing a memory cell current in a bit line, in one embodiment. In one embodiment, the magnitude of the memory cell current from each memory cell in the node is multiplied by a different power of two to produce a multiplied signal for each memory cell. The powers of two include two raised to the zeroth power, in one embodiment. Thus, multiplication by "1" is included in the concept of multiplication by a different power of two. The multiplication by the different powers of two enables each memory cell in the node to, in effect, store a different bit of the multiplicand, in one embodiment. The multiplied signals are summed to generate a "summed signal," in one embodiment. The magnitude of the summed signal represents a product of the multiplier and a multiplicand stored in the node. Thus, "binary memory cells" may be used to perform multiplication. However, note that it is not required that binary memory cells be used. In some embodiments, a multi-state memory cell is used to perform multiplication. In some embodiments, the multi-state memory cells are each programmed to one of two physical states.

In order to achieve precise multiplication, both the multiplier and multiplicand should be able to represent multiple different values. It is not necessarily challenging to precisely generate a voltage that has one of multiple possible magnitudes. Hence, if the multiplier is represented by the magnitude of a voltage, a wide range of multipliers can precisely be achieved. Note that herein, the term "multiplier" is used for the multiply voltage, and the term "multiplicand" is used for the value stored in the node of memory cells. This is for convenience of discussion. The terms "multiplier" and "multiplicand," as used herein, are interchangeable.

It can be challenging to program non-volatile memory cells in a manner to precisely represent the multiplicand. For example, some memory cells have adjustable resistors that can be programmed to different resistances. Thus, such a memory cell might be programmed to one of, for example, eight different resistance states in order to represent a multiplicand. However, there should be a linear relationship between the resistance states in order for the multiplication to be precise. For many types of non-volatile memory cells, the relationship between the resistance states is non-linear.

One embodiment overcomes such limitations by storing a multiplicand in a selected node of multiple non-volatile memory cells, where each memory cell in the selected node stores a different bit of the multiplicand. A multiply voltage is simultaneously applied to each non-volatile memory cell in the selected node to cause each memory cell to pass a memory cell current. The magnitudes of the memory cell currents are multiplied by a different power of two to pass a multiplied signal for each memory cell, and the multiplied memory cell signals are summed to generate a summed signal. The summed signal represents a product of the multiplier times a multiplicand stored in the selected node. In one embodiment, vector/vector multiplication is performed using a column of nodes of non-volatile memory cells.

Prior to further discussion of multiplication using non-volatile memory cells, an example memory system 100 in which embodiments may be practiced will be discussed. FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102. In one embodiment, memory system 100 is used as a neuromorphic computing system.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading (or sensing) operations. The managing or control circuits are used to perform multiplication using non-volatile memory cells, in one embodiment. Herein, multiplication will be referred to as a type of memory array operation.

In some embodiments, the managing or control circuits (or a portion of the managing or control circuits) for facilitating one or more memory array operations (including multiplication) may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses. Memory core control circuits 108 may include logic for controlling the generation of voltage references for biasing a particular memory array in order to perform multiplication using non-volatile memory cells.

Memory chip controller 104 controls operation of memory chip 106. Once a read, write, or multiply operation is initiated by memory chip controller 104, memory core control circuits 108 may generate the appropriate bias voltages for bit lines, source lines and/or word lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an on-chip memory controller for determining row and column address, bit line, source line and word line addresses, memory array enable signals, and data latching signals.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

In one embodiment, memory core 110 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory core 110 is not limited to the examples above. Many different types of memory array architectures or memory technologies can be used to form memory core 110. No particular non-volatile memory technology is required for purposes of the new claimed embodiments proposed herein. Other examples of suitable technologies for memory cells of the memory core 110 include ReRAM memories, ferroelectric field effect transistor (FeFET) memory, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory core 110 include two dimensional arrays, three dimensional arrays, cross-point arrays, stacked two dimensional arrays, vertical bit line arrays, and the like.

One example of a ReRAM, or PCMRAM, cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
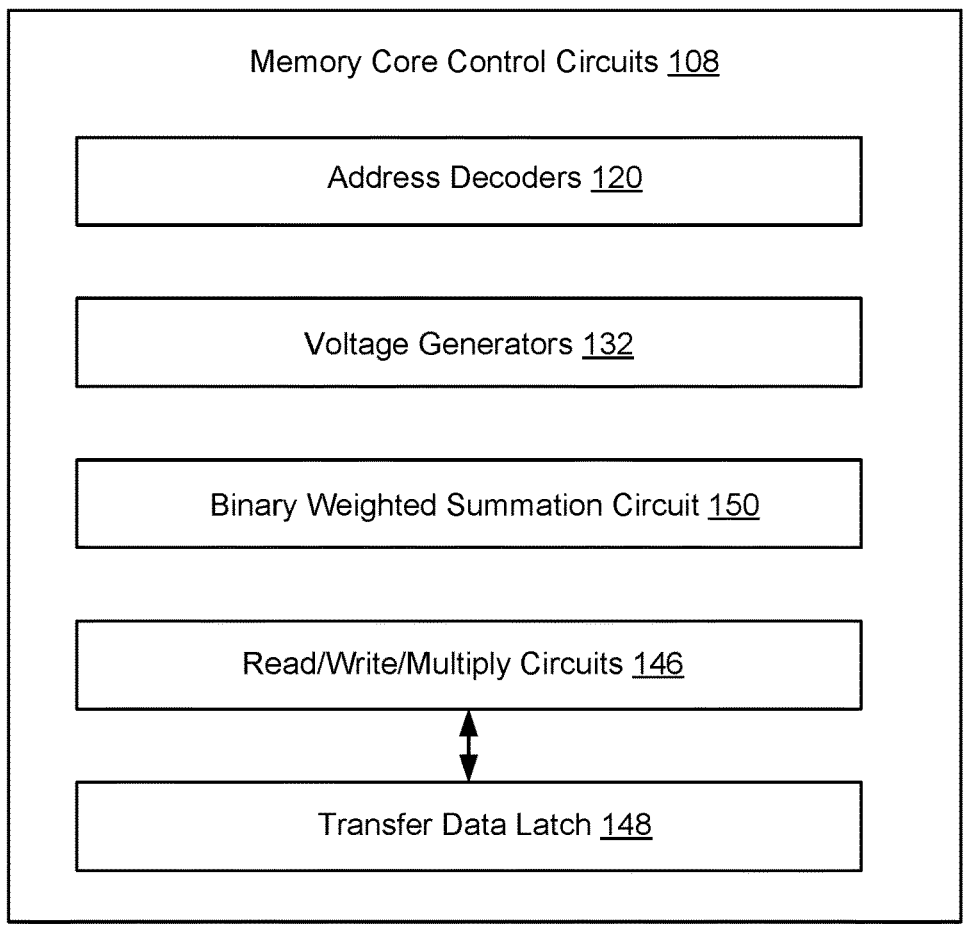
FIG. 1B depicts an embodiment of memory core control circuits.

FIG. 1B depicts an embodiment of memory core control circuits 108. As depicted, memory core control circuits 108 include address decoders 120, voltage generators 132, transfer data latch 148, read/write/multiply circuits 146, and binary weighted summation circuit 150. The voltage generators (or voltage regulators) 132 may generate voltages for control lines.

Read/write/multiply circuits 146 include circuitry for reading and writing memory cells in the memory core 110. In an embodiment, transfer data latch 148 is used for intermediate storage between memory chip controller 104 (FIG. 1A) and memory cells. In an embodiment, when host 102 instructs memory chip controller 104 to write data to memory chip 106, memory chip controller 104 writes host data to transfer data latch 148. Read/write circuits 146 then write data from transfer data latch 148 to a specified page of memory cells. In an embodiment, transfer data latch 148 has a size equal to the size of a page. In an embodiment, when host 102 instructs memory chip controller 104 to read data from memory chip 106, read/write circuits 146 read from a specified page into transfer data latch 148, and memory chip controller 104 transfers the read data from transfer data latch 148 to host 102. Address decoders 120 may generate memory block addresses, as well as row addresses and column addresses for a particular memory block.

The read/write/multiply circuits 146 also include circuitry for performing multiply operations using memory cells. In one embodiment, the write circuit is used to store multiplicands in the memory cells. The write circuit stores a multiplicand into a node of "r" memory cells, in one embodiment. In one embodiment, the multiplicand has "r" bits. Each memory cell in a node stores one of the "r" bits of the multiplicand, in one embodiment.

In one embodiment, the multiply circuit is used to apply multiply voltages to memory cells that store multiplicands. Each multiply voltage has a magnitude that represents a multiplier, in one embodiment. Each memory cell in a node passes a memory cell current in response to the multiply voltage, in one embodiment. The magnitude of the memory cell current depends on the physical state of the memory cell and the magnitude of the multiply voltage, in one embodiment. For example, the magnitude of a memory cell current depends on the resistance of the memory cell and the voltage applied between two terminals of the memory cell, in one embodiment. The magnitude of the memory cell current depends on whether the memory cell is in a first physical state or a second physical state, in one embodiment. Each physical state may be represented by a physical parameter including, but not limited to, a memory cell resistance, or a memory cell transistor threshold voltage.

The multiply voltage may be similar in magnitude to a read voltage, in that the multiply voltage may cause the memory cell to pass the memory cell current without changing the physical state of the memory cell. However, whereas a read voltage may have a magnitude that is selected to delineate between physical states, the magnitude of the multiply voltage is not necessarily selected to delineate between physical states. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The binary weighted summation circuit 150 may be used during multiplication. The binary weighted summation circuit 150 is configured to process each of the memory cell currents from one or more nodes of memory cells. The binary weighted summation circuit 150 multiplies the magnitude of the memory cell current from each memory cell in a selected node by a different power of two to pass a multiplied signal for each memory cell, and sums the multiplied signals for the selected node, in one embodiment. Thus, the binary weighted summation circuit 150 may generate a summed signal that represents a product of the multiplier times a multiplicand stored in the selected node.

The binary weighted summation circuit 150 may also be used to generate a summed signal that represents a dot product of two vectors. A column of nodes is used to store elements of a first vector, in one embodiment. The column of nodes is associated with "r" bit lines, in one embodiment. Each node may have "r" non-volatile memory cells, wherein each bit line is associated with one memory cell in each of the nodes. The multiply circuit may simultaneously apply a different multiply voltage to each node. Each multiply voltage may correspond to an element of a second vector. The binary weighted summation circuit 150 may multiply the current in each bit line by a different power of two, and sum the multiplied currents in the "r" bit lines to generate a vector multiplication result signal that represents multiplication of the first vector by the second vector.

Figure 1C:
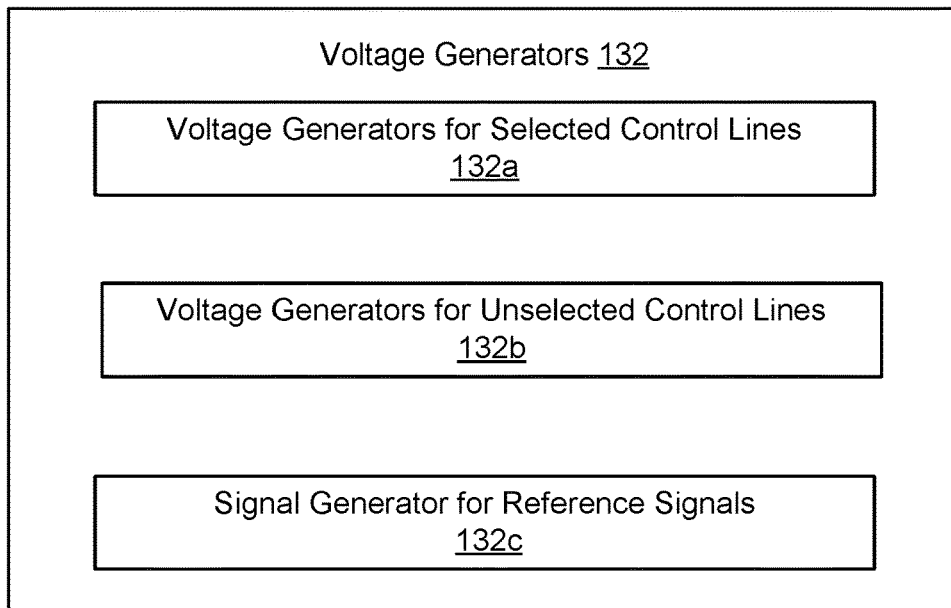
FIG. 1C depicts further details of one embodiment of voltage generators.

FIG. 1C depicts further details of one embodiment of voltage generators 132. The voltage generators include voltage generators for selected control lines 132a, voltage generators for unselected control lines 132b, and signal generators for reference signals 132c. Control lines may include bit lines, source lines and word lines, or a combination of bit lines, source lines and word lines. Voltage generators for selected control lines 132a may be used to generate program, read, and/or multiply voltages. In one embodiment, the voltage generators for selected control lines 132a generate a voltage whose magnitude is based on a multiplier for a mathematical multiplication operation. In one embodiment, the voltage difference between the voltages for two selected control lines is a multiply voltage.

Voltage generators for unselected control lines 132b may be used to generate voltages for control lines that a connected to memory cells that are not selected for a program, read, or multiply operation. The signal generators for reference signals 132c may be used to generate reference signals (e.g., currents, voltages) to be used as a comparison signal to determine the physical state of a memory cell.

Figure 2A:
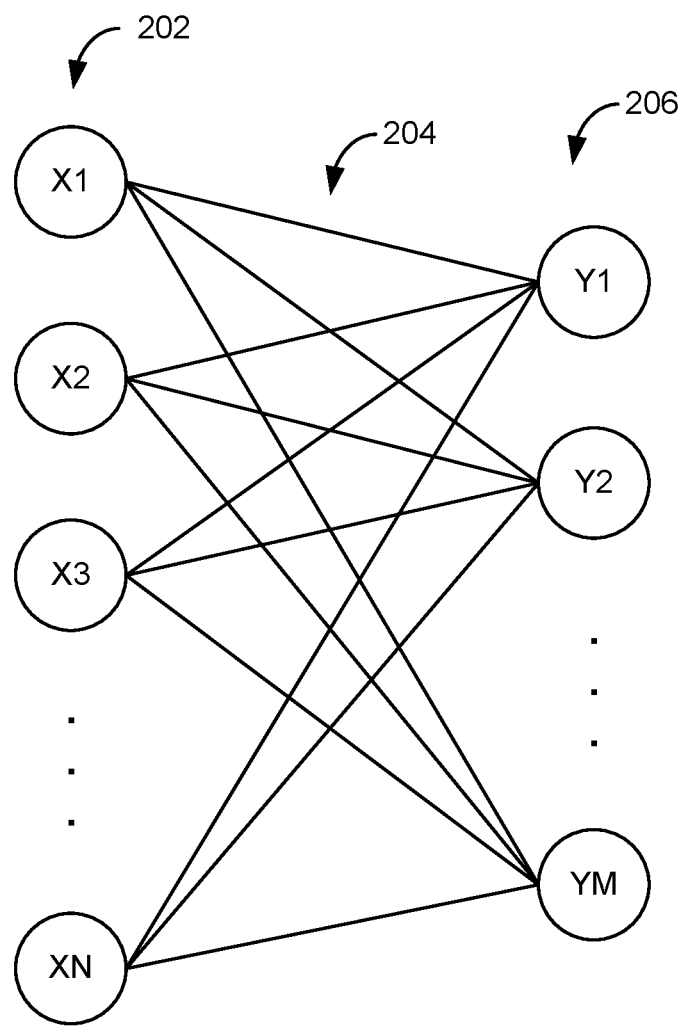
FIG. 2A shows an example of an N to M artificial neural network.

In one embodiment, non-volatile memory cells are used to perform multiplication in a neuromorphic computing system. A neuromorphic computing system may be used to implement an artificial neural network. FIG. 2A shows an example of an N to M artificial neural network 200. The artificial neural network 200 has "N" input neurons 202 and "M" output neurons 206. A number of synapses 204 connect input neurons 202 to output neurons 206. Each of the input neurons 202 may be associated with a mathematical number. Likewise, each of the synapses 204 may be associated with a mathematical number, which is typically referred to as a "weight." Equation 1 represents a calculation that may be performed for each of the "M" output neurons 206.

$$Y_M = \sum_{1}^{N} X_N \times W_{NM} \qquad \text{Eq. 1}$$

In Equation 1, $Y_M$ represents the output neuron 206 for which Equation 1 is presently being applied; $X_N$ represents the input neurons 202; and $W_{NM}$ represents the weight of the synapse 204 that connects one input neuron 202 to the output neuron 206 for which Equation 1 is presently being applied ($Y_M$). As noted above, each synapse has a "weight". Thus, Equation 1 may be implemented by a multiply and accumulate of the product of the values of the N input neuron 202 by the weight of the synapse 204 that connects each respective input neuron 202 to $Y_M$. The multiply and accumulate can also be referred to as a vector/vector multiply (e.g., dot product of two vectors). The first vector being an "n" element vector defined by the values for the N input neuron 202, and the second vector being an "n" element vector defined by the weights of the N synapses 204 that connect the N input neurons 202 to $Y_M$.

Figure 2B:
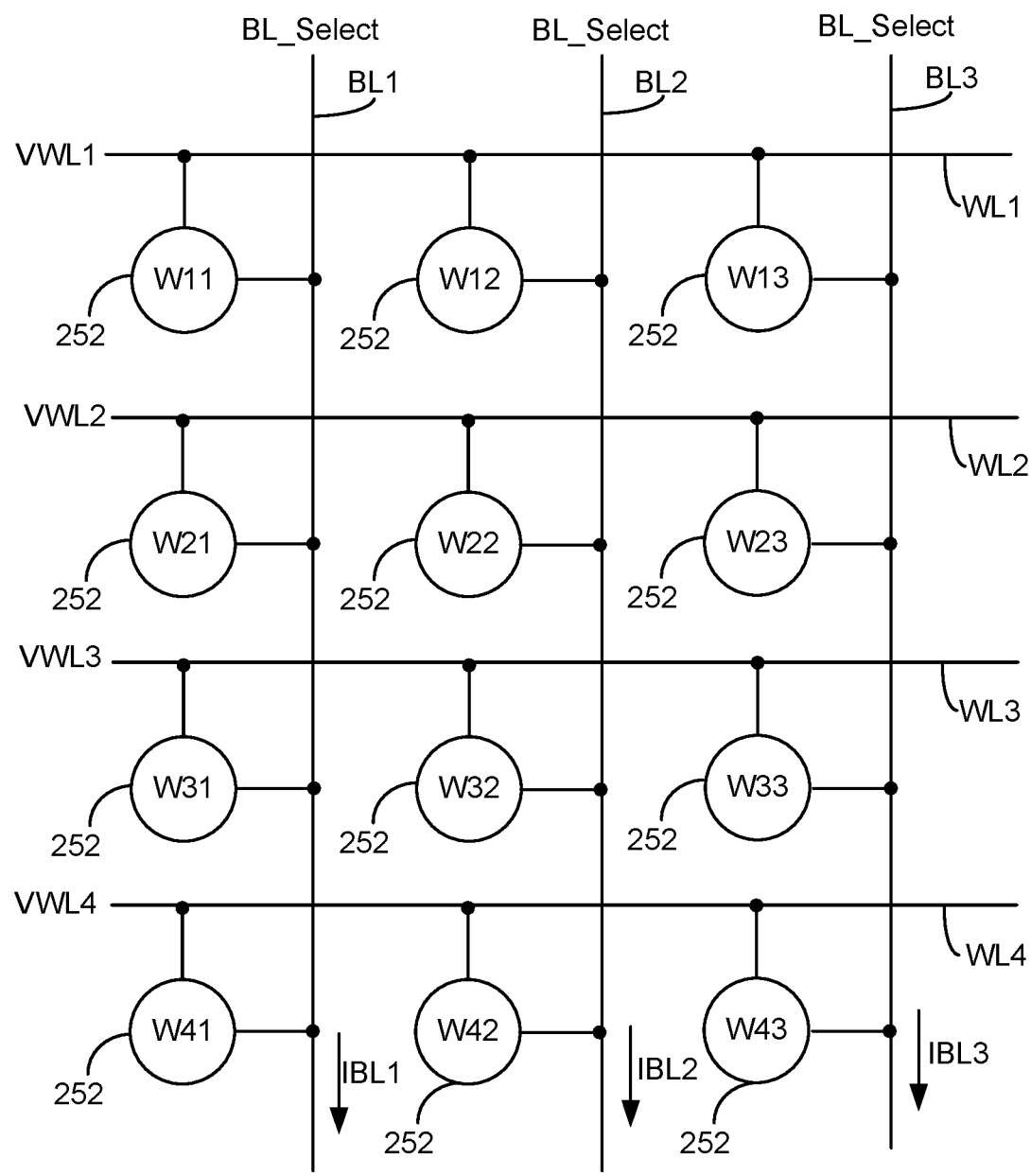
FIG. 2B depicts an example of a portion of a cross-point memory array.

One technique for performing the multiply and accumulate (or vector/vector multiply) is to use a cross-point memory array. FIG. 2B depicts an example of a portion of a cross-point memory array 250. The cross-point memory array 250 may be used to perform a multiply and accumulate operation. The depicted portion of the array 250 has four word lines (WL1, WL2, WL3, WL4) and three bit lines (BL1, BL2, BL3). The depicted portion of the array 250 may be used to execute Equation 1 for a case in which N=4 and M=3.

A number of non-volatile memory cells 252 are depicted. Each non-volatile memory cells 252 could include an adjustable resistor, as one example. Each memory cell 252 is labeled with a weight (e.g., W11, W21, etc.). These weights ($W_{NM}$) correspond to the weights that represent the synapse 204 that connects one input neuron 202 to the output neuron 206. For some types of memory cells, the adjustable resistor can be programmed to a range of resistances. Thus, the weight may be related to the resistance of the adjustable resistor.

Voltages VWL1, VWL2, VWL3, and VWL4 are shown being applied to the respective word lines WL1, WL2, WL3, WL4. The magnitudes of these voltages correspond to the input neurons 202. Thus, the set of voltages VWL1, VWL2, VWL3, and VWL4 correspond to $X_N$ in Equation 1. A bit line select voltage (BL_Select) is applied to each bit line to select that bit line. For ease of explanation, it will be assumed that BL_Select is zero volts, such that the voltage across each memory cell 252 is the word line voltage. Each memory cell 252 may pass a current that is based on its resistance and the voltage applied to the memory cell. This "memory cell current" flows to the bit line connected to the memory cell 252. The memory cell current may be viewed as the product of multiplying a mathematical value represented by the word line voltage by a mathematical value represented by the resistance of the memory cell. Stated another way, the memory cell current may be viewed as a representation of the product of multiplying one of the elements of an input vector by the weight stored in the memory cell.

A number of bit line currents (IBL1, IBL2, IBL3) are depicted. Each bit line current is the summation of the currents of the memory cells connected to that bit line. Thus, each bit line current may be viewed as representing an accumulation of the products discussed in the prior paragraph. Therefore, the magnitude of a bit line current may be viewed to represent a vector/vector multiplication (e.g., dot product of two vectors). Furthermore, with reference to Equation 1, the magnitude of a bit line current may represent one of the output neurons (e.g., $Y_M$).

For the architecture in FIG. 2B, in order for the multiply and accumulate to be precise, the weights should be able to have a variety of values. However, some memory cells can only be reliably programmed to two states. Hence, such memory cells may not be suitable for multiply and accumulate in the architecture in FIG. 2B. Some memory cells can be programmed to more than two states. For example, some adjustable resistance memory cells can be programmed to more than two resistances. However, for such multi-state memory cells to pass precise MAC in the architecture in FIG. 2B, there should be a linear relationship between the resistance states. Unfortunately, many multi-state memory cells exhibit a non-linear relationship between the resistance states. Therefore, accuracy in MAC may be imprecise when such memory cells are used in the architecture in FIG. 2B.

Figure 3A:
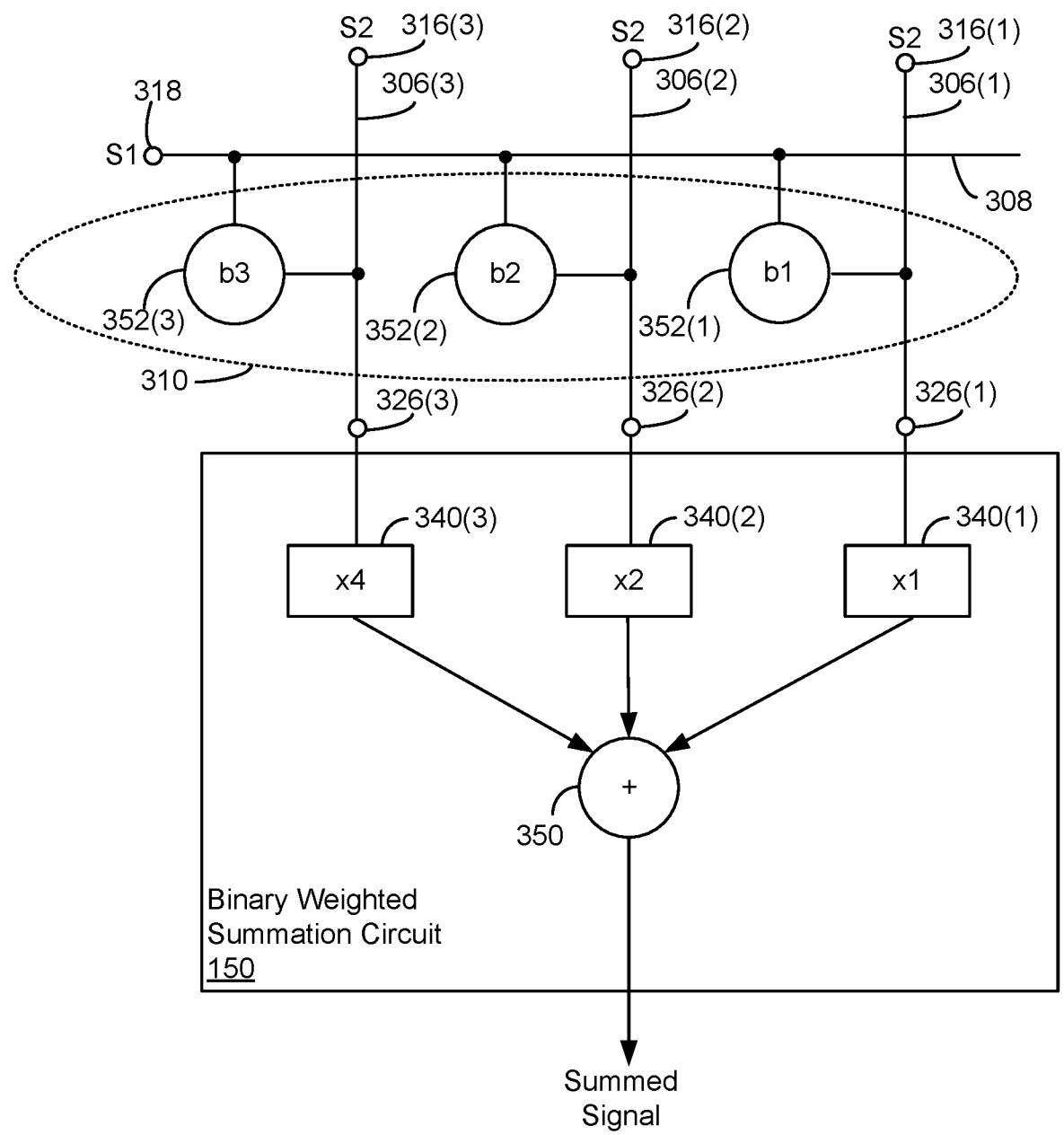
FIG. 3A is a diagram of one embodiment of an apparatus having two-terminal memory cells that may be used to perform multiplication.

FIG. 3A is a diagram of one embodiment of an apparatus 300 that may be used to perform multiplication. The apparatus 300 may be included in a non-volatile storage device. The apparatus is contained within memory system 100, in one embodiment. The apparatus resides on memory chip 106, in one embodiment. FIG. 3 shows one node 310 in a cross-point memory array. The cross-point memory array typically has additional nodes 310. For example, there may be rows and columns of nodes 310. In the embodiment of FIG. 3A, there are three memory cells 352(1), 352(2), 352(3) in the node 310. The reference numeral 352 may be used to refer to a memory cell without reference to a specific memory cell. In general, there may be two or more memory cells 352 per each node 310.

Each memory cell 352 is electrically connected to first conductive line 308. In one embodiment, first conductive line 308 is referred to as a word line. There is a set of second conductive lines 306(1), 306(2), 306(3). The reference numeral 306 may be used to refer to a second conductive without reference to a specific line. In one embodiment, the second conductive lines 306 are referred to as bit lines. Each memory cell 352 in the node 310 is electrically connected to a different second conductive line 306.

Each memory cell 352 is programmed to one of two different states, in one embodiment. For the sake of discussion, one state may be referred to as "0" and the other state as "1". Thus, it may be stated that each memory cell 352 stores one bit. In one embodiment, each memory cell 352 has an adjustable resistor, and the two different states are two different resistances (or alternatively conductances). In one embodiment, each memory cell 352 has a transistor with an adjustable threshold voltage, and the two different states are two different transistor threshold voltages.

A node 310 is a unit of two or more memory cells 352 that may be used to multiply two mathematical values. One mathematical value is stored in the node 310, and the other mathematical value is represented by a voltage applied to the memory cells 352 in the node. The memory cells 352 in the node 310 may be used to collectively store a mathematical value, in one embodiment. In one embodiment, the memory cells 352 in the node 310 collectively store a multiplicand. The multiplicand may be a weight in a neural network. In one embodiment, each memory cell 352 in the node 310 represents a different position in a binary number system. For example, memory cell 352(1) may represent the "1s" position, memory cell 352(2) may represent the "2s" position, and memory cell 352(3) may represent the "4s" position. Thus, the memory cells in the node 310 may collectively store three bits of information, in one embodiment.

The number of memory cells 352 in a node 310 relates to the resolution, in one embodiment. For example, the multiplicand may be a value between 0 and 1, such that with three bits the node 310 can represent the following values (0, 0.125, 0.25, 0.375, 0.5, 0.625, 0.75, 0.825). Adding more memory cells 352 to the node 310 can achieve greater resolution for the multiplicand over the same range. The range between 0 and 1 is just one example, as are the example values within the range.

The multiply circuit 146 is configured to apply a multiply voltage to each memory cell. The phrase, "apply a multiply voltage to a memory cell," or the like, means to apply the multiply voltage across two terminals of the memory cell. Moreover, applying a multiply voltage to a memory cell results in a memory cell current that has a magnitude that depends on the physical state (e.g., resistance, Vt) of the memory cell and the magnitude of the multiply voltage. In one embodiment, the magnitude of the memory cell current is a function of the resistance of an adjustable resistor in the memory cell and the magnitude of the multiply voltage. In one embodiment, the magnitude of the memory cell current is a function of the Vt of a transistor in the memory cell and the magnitude of the multiply voltage. The phrase, "apply a multiply voltage to a node of memory cells," or the like, means to apply the same multiply voltage to each memory cell in the node.

The multiply voltage may be applied between the first conductive line 308 and one of the second conductive lines 306 in order to apply the multiply voltage to a memory cell, in the embodiment of FIG. 3A. The first conductive line 308 has a first terminal 318 to which the multiply circuit 146 applies a first signal S1. Each of the second conductive lines 306 has a second terminal 316(1), 316(2), 316(3). The multiply circuit 146 applies a second signal S2 to each of the second terminals 316(1), 316(2), 316(3). Typically, the magnitude of the second signal S2 is the same for each second conductive line 306(1), 306(2), 306(3) associated with the node 310 Also, in one embodiment, the voltage on the second conductive lines 306 is a select voltage, which is also fixed voltage. By fixed voltage in this context it is meant that all of the second conductive lines 306 that are selected have the same magnitude voltage applied thereto. Thus, in one embodiment, the voltage on the first conductive line 308 is varied in order to apply the multiply voltage. Thus, the multiply circuit 146 may apply a voltage between two terminals of each memory cell (e.g., the difference between S1 and S2). In one embodiment, the voltage difference between S1 and S2 is the same for each memory cell 352 in the node 310.

In one embodiment, the magnitude of the multiply voltage represents a multiplier. Thus, the same multiplier may be applied to each memory cell 352 in the node 310. The apparatus 300 multiplies the multiplier by a multiplicand that is collectively stored in the memory cell 352 in the node 310, in one embodiment.

Each memory cell 352 passes a memory cell current in response to the multiply voltage applied to that memory cell, in one embodiment. The memory cell current may be passed to the second conductive line 306. Each memory cell 352 causes a current (referred to as a memory cell current) in the second conductive line 306 in response to the multiply voltage applied to that memory cell, in one embodiment. Each memory cell 352 provides a current (referred to as a memory cell current) to the second conductive line 306 in response to the multiply voltage applied to that memory cell, in one embodiment. The memory cell current appears at a node 326 of a second conductive line. Thus, a first memory cell current for memory cell 352(1) flows at node 326(1), a second memory cell current for memory cell 352(2) flows at node 326(2), and a third memory cell current for memory cell 352(3) flows at node 326(3).

The binary weighted summation circuit 150 is configured to multiply and sum the magnitudes of the memory cell currents. Circuit 150 has three multipliers 340(1), 340(2), 340(3) and one summer 350. Reference numeral 340 may be used to refer to a multiplier without reference to a specific multiplier. Each multiplier 340 multiplies a magnitude of a memory cell current by a different power of two, in one embodiment. The powers of two include two raised to the zeroth power, in one embodiment. Thus, multiplication by "1" is included in the concept of multiplication by a different power of two. In the example of FIG. 3A, the powers of two are $2^0$, $2^1$, and $2^2$. Thus, the powers of two start at $2^0$ and progress consecutively to higher powers, in one embodiment. In one embodiment, when there are "r" memory cells 352 in the node 310, the powers start at $2^0$ and end at $2^{(r-1)}$.

As noted above, the magnitude of the multiply voltage may represent a multiplier. In one embodiment, each memory cell 352 stores one digit of a multiplicand. The multiplication by the differ powers of two is what enables each memory cell 352 to store a different digit of the multiplicand, in one embodiment. Thus, each memory cell 352 can be programmed to one of two states. In one embodiment, the magnitude of the memory cell current from each memory cell 352 represents a product of the multiplier by the digit of the multiplicand stored in the particular memory cells.

Multiplying the magnitudes of the memory cell currents by a different power of two may result in multiplied signals. The multiplied signals are currents, in one embodiment. The multiplied signals are digital values, in one embodiment. The multiplied signals are summed by summer 350. In one embodiment, the three multipliers 340(1), 340(2), 340(3) multiply the magnitude of a current, and the summer sums the magnitudes of the three multiplied currents. Circuit 150 output a summed signal from the summer 350. The summed signal represents a product of the multiplier times a multiplicand stored in the node 310.

The way in which the summed signal is analyzed and used may depend on the application. The summed signal is an analog signal, in one embodiment. In one embodiment, the summed signal is input to an analog-to-digital converter (A/D), which may generate a multi-bit signal whose value reflects the magnitude of the summed signal. Thus, the multi-bit signal is the product of the multiplier and the multiplicand, in one embodiment. However, it is not required that the summed signal be converted to a digital signal. In one embodiment, a sense amplifier is used to compare the magnitude of the summed signal to a reference current. The sense amplifier may output a signal (e.g., one bit of information) that indicates whether the magnitude of the summed signal is less than or greater than the reference current. In one embodiment, the magnitude of the summed signal may be input to an activation function in an artificial neural network. In some applications, the activation function outputs a "fire" or "don't fire" signal based on the magnitude of the summed signal.

In one embodiment, the binary weighted summation circuit 150 is configured to simultaneously multiply the magnitude of the memory cell current from each memory cell 352 in the node 310 and sum the magnitudes of the multiplied memory cell currents for the selected node 310. The memory cell current from each memory cell 352 is an analog signal, in one embodiment. The binary weighted summation circuit 150 comprises analog circuitry, such as current mirrors, to perform current multiplication and current summing, in one embodiment. The simultaneous operation avoids delays that could otherwise be incurred by converting analog memory cell currents to digital signals, in order to process the memory cell currents. Note that herein a phrase such as "multiply a current" includes inputting a current into analog circuity (e.g., a current mirror), which passes an output current having a magnitude that is based on the magnitude of the input current.

The apparatus 300 provides for very precise multiplication. For many memory cells, the memory cells can be reliably programmed to one of two physical states, where the physical state has precise physical value. For example, a memory cell with an adjustable resistor can be programmed to either a high resistance state or a low resistance state, wherein there may be relatively little cell to cell variation in the resistance of the high resistance state, and relatively little cell to cell variation in the resistance of the low resistance state. The terms "high resistance state" and "low resistance state," when used together means that the high resistance state has a higher resistance than the low resistance state. In one embodiment, the low resistance state is referred to as a "SET" state and the high resistance is referred to as a "RESET" state. As another example, a memory cell with an adjustable transistor threshold voltage can be programmed to either a high threshold voltage state or a low threshold voltage state, wherein there may be relatively little cell to cell variation in the threshold voltage of the high threshold voltage state, and relatively little cell to cell variation in the threshold voltage of the low threshold voltage. The terms "high threshold voltage state" and "low threshold voltage state," when used together means that the high threshold voltage state has a higher threshold voltage than the low threshold voltage state. Thus, each memory cell 352 should pass a similar memory cell current when it is in the low physical state (e.g., low resistance or low threshold voltage). Likewise, each memory cell 352 should pass a similar memory cell current when it is in the high physical state (e.g., high resistance or high threshold voltage). Moreover, the binary weighted summation circuit 150 can very precisely multiply by one of the powers of two, in one embodiment. Hence, the summed signal may precisely represent multiplication of the multiplier and the multiplicand.

Figure 3B:
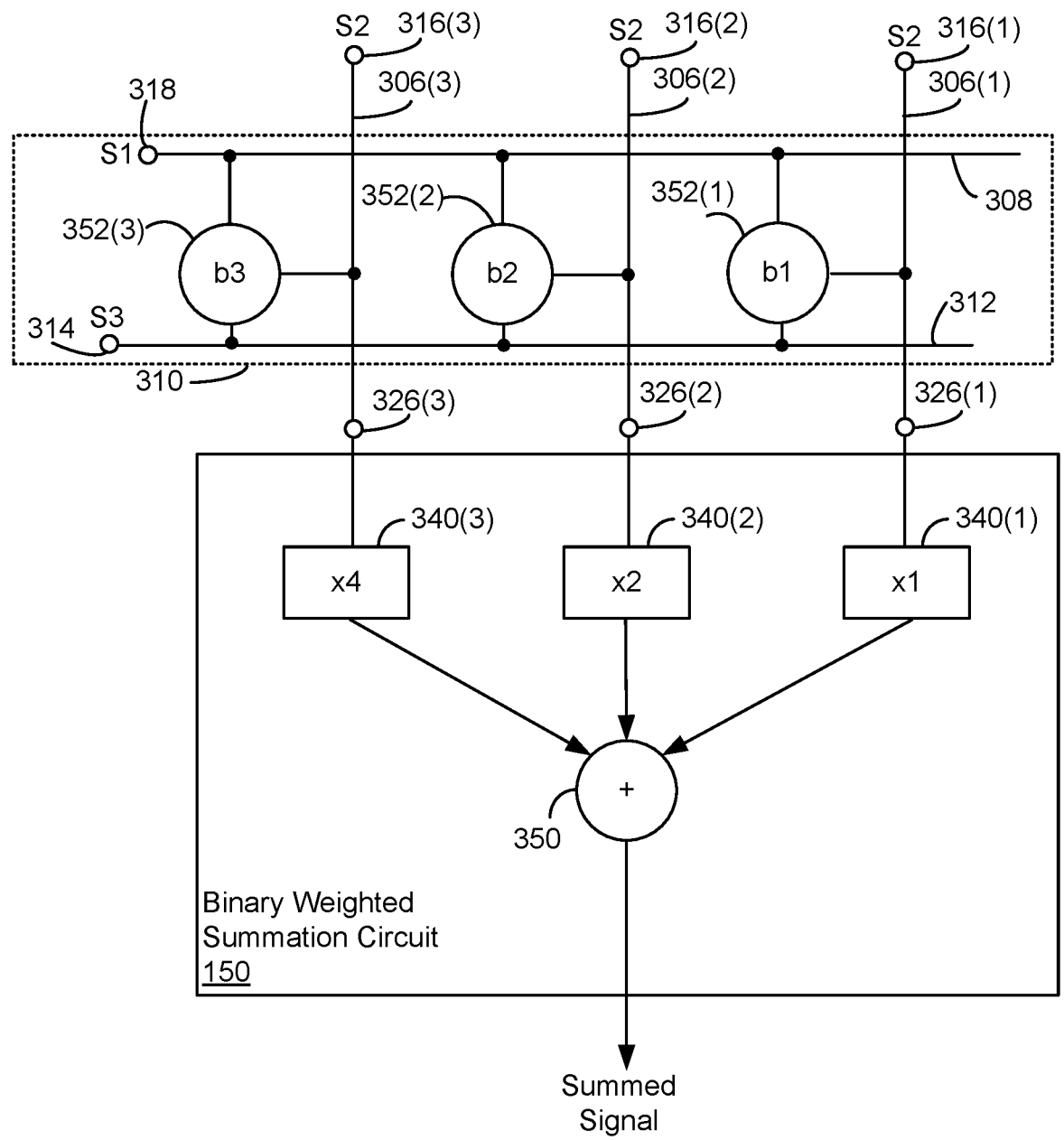
FIG. 3B is a diagram of one embodiment of an apparatus having three-terminal memory cells that may be used to perform multiplication.

In one embodiment, each memory cell 352 is a three-terminal device. FIG. 3B depicts one embodiment of an array 350 in which each memory cell 352 is a three-terminal memory device. The three-terminal architecture adds a third conductive line 312 in addition to a first conductive line 308 and second conductive lines 306. In one embodiment, the third conductive line 312 is referred to as a source line. A voltage S3 is applied to a source terminal 314 of the source line 312.

Some three-terminal memory cells have a transistor. In some embodiments, the gate terminal of the transistor is connected to the first conductive line 308. The gate terminal of the transistor is provided with a fixed voltage during one embodiment of a multiplication operation. By a "fixed voltage" it is meant that when there are more nodes in the array, each first conductive line 308 that is selected receives the same magnitude voltage. Also, in one embodiment, the voltage on the second conductive lines 306 is a select voltage (to select memory cells connected to the second conductive line 306), which is also a fixed voltage. By this it is meant that all of the second conductive lines 306 that are selected have the same magnitude voltage applied thereto. Thus, in one embodiment, the voltage on the third conductive line 312 is varied in order to apply the multiply voltage to a memory cell 352.

A three-terminal memory cell may respond to the multiply voltage by producing a memory cell current that has a magnitude that depends on the physical state (e.g., resistance, Vt) of the memory cell. The memory cell current may depend on the voltage across two of the three terminals. For one type of three-terminal memory cell, the memory cell current may depend on the voltage between the first conductive line 308 and third conductive line 312. Thus, the multiply voltage is applied between the first conductive line 308 and third conductive line 312, in one embodiment. For another type of three-terminal memory cell, the memory cell current may depend on the voltage between the second conductive line 308 and the third conductive line 312. Thus, the multiply voltage is applied between the second conductive line 308 and the third conductive line 308, in one embodiment.

Figure 4A:
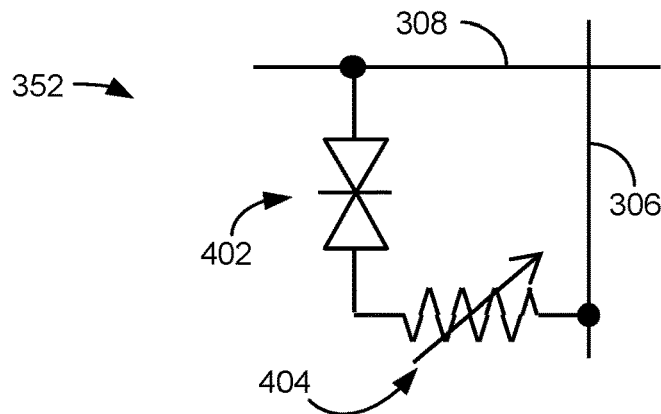
FIG. 4A depicts an example two-terminal device, which may be used as a memory cell to perform multiplication.

A wide variety of non-volatile memory cells can be used in the memory nodes 310. FIG. 4A shows an example two-terminal memory cell that may be used in one embodiment of FIG. 3A. In this example, the two-terminal device has a selector 402 and an adjustable resistor 404. The adjustable resistor 404 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching material include a phase change material, a ferroelectric material, a metal oxide (e.g., hafnium oxide), a barrier modulated switching structure, or other similar reversible resistance-switching materials. The selector 402 may be a diode, which may be used to reduce leakage currents. The selector 402 is sometimes referred to as a steering element or as an isolation element.

One terminal of the two-terminal device is connected to the first conductive line 308. The other terminal is connected to the second conductive line 306. In the depicted configuration, the selector 402 is directly connected to the first conductive line 308 and the adjustable resistor 404 is directly connected to the second conductive line 306. However, in another configuration, the selector 402 is directly connected to the second conductive line 306 and the adjustable resistor 404 is directly connected to the first conductive line 308. In one embodiment, a multiply voltage is applied between first conductive line 308 and second conductive line 306 during a multiplication operation. The current in the second conductive line 306 depends on the magnitude of the multiply voltage and the resistance of the adjustable resistor 404, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 4B:
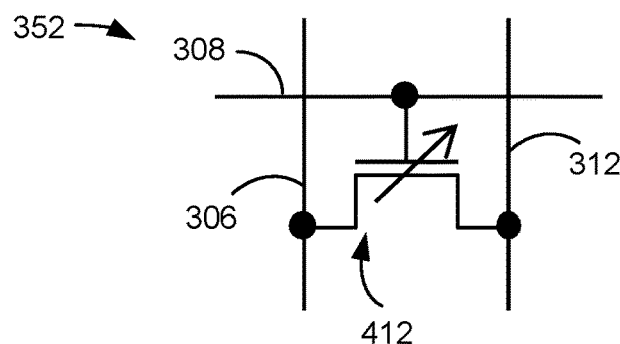
FIG. 4B depicts an example three-terminal device having an adjustable threshold voltage (Vt) transistor, which may be used as a memory cell to perform multiplication.
Figure 4C:
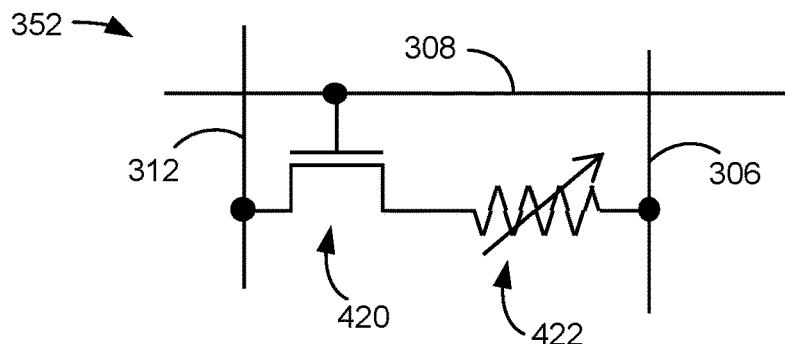
FIG. 4C depicts an example three-terminal device having an access transistor and an adjustable resistor, which may be used as a memory cell to perform multiplication.

In some embodiments, the memory cells 352 in a node 310 are three-terminal memory cells. FIGS. 4B and 4C show two example three-terminal memory cells 352. FIG. 4B depicts a three-terminal device having an adjustable threshold voltage (Vt) transistor 412 that has an adjustable threshold voltage. In one embodiment, the adjustable Vt transistor 412 has a low threshold voltage state and a high threshold voltage state. The high Vt state is a low current (or off) state, in one embodiment. The low Vt state is a high current (or on) state, in one embodiment. The adjustable Vt transistor 412 can be repeatedly switched between the low threshold voltage state and the high threshold voltage state. The adjustable Vt transistor 412 may be a ferroelectric field effect transistor (FeFET).

A first terminal (transistor gate) of the adjustable Vt transistor 412 is connected to the first conductive line 308. A second terminal of the adjustable Vt transistor 412 is connected to the second conductive line 306. The third terminal of the adjustable Vt transistor 412 is connected to the third conductive line 312. In one embodiment, the first conductive line 308 provides a fixed voltage to the gate of the transistor 412 during the multiplication operation. In one embodiment, the voltage to the gate of the adjustable Vt transistor 412 is tuned such that the adjustable Vt transistor 412 operates in the linear regime. If the gate voltage is greater than the sum of the maximum voltage on the third conductive line 312 and the maximum Vt of the adjustable Vt transistor 412, then the adjustable Vt transistor 412 operates in the linear regime, in one embodiment.

In one embodiment, a multiply voltage is applied between the first conductive line 308 and third conductive line 312 during a multiplication operation. The current in the second conductive line 306 depends on the magnitude of the multiply voltage and the Vt of the adjustable Vt transistor 412, in one embodiment. In one embodiment, there is a linear relationship between the magnitude of the multiply voltage and the on-current of the Vt transistor 412. There may also be a linear relationship between the magnitude of the multiply voltage and the off-current of the Vt transistor 412, but this is not required.

FIG. 4C depicts an example three-terminal device, which may be used as a memory cell 352. In this example, the three-terminal device has an access transistor 420 and an adjustable resistor 422. The adjustable resistor 422 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching materials include a phase change material, a ferroelectric material, a metal oxide (e.g., hafnium oxide), a barrier modulated switching structure, or other similar reversible resistance-switching materials. Access transistor 420 is a field effect transistor (FET), in one embodiment. Access transistor 420 is a bipolar junction transistor (BJT), in one embodiment.

A first (transistor gate) terminal of the memory cell 352 in FIG. 4C is connected to the first conductive line 308. A second terminal is connected to the second conductive line 306. The third terminal of the memory cell 352 is connected to the third conductive line 312. In one embodiment, the first conductive line 308 provides a fixed voltage to the gate of the access transistor 420 during the multiplication operation. In one embodiment, a multiply voltage is applied between second conductive line 306 and third conductive line 312 during a multiplication operation. The current in the second conductive line 306 depends on the magnitude of the multiply voltage and the resistance of the adjustable resistor 422, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 5A:
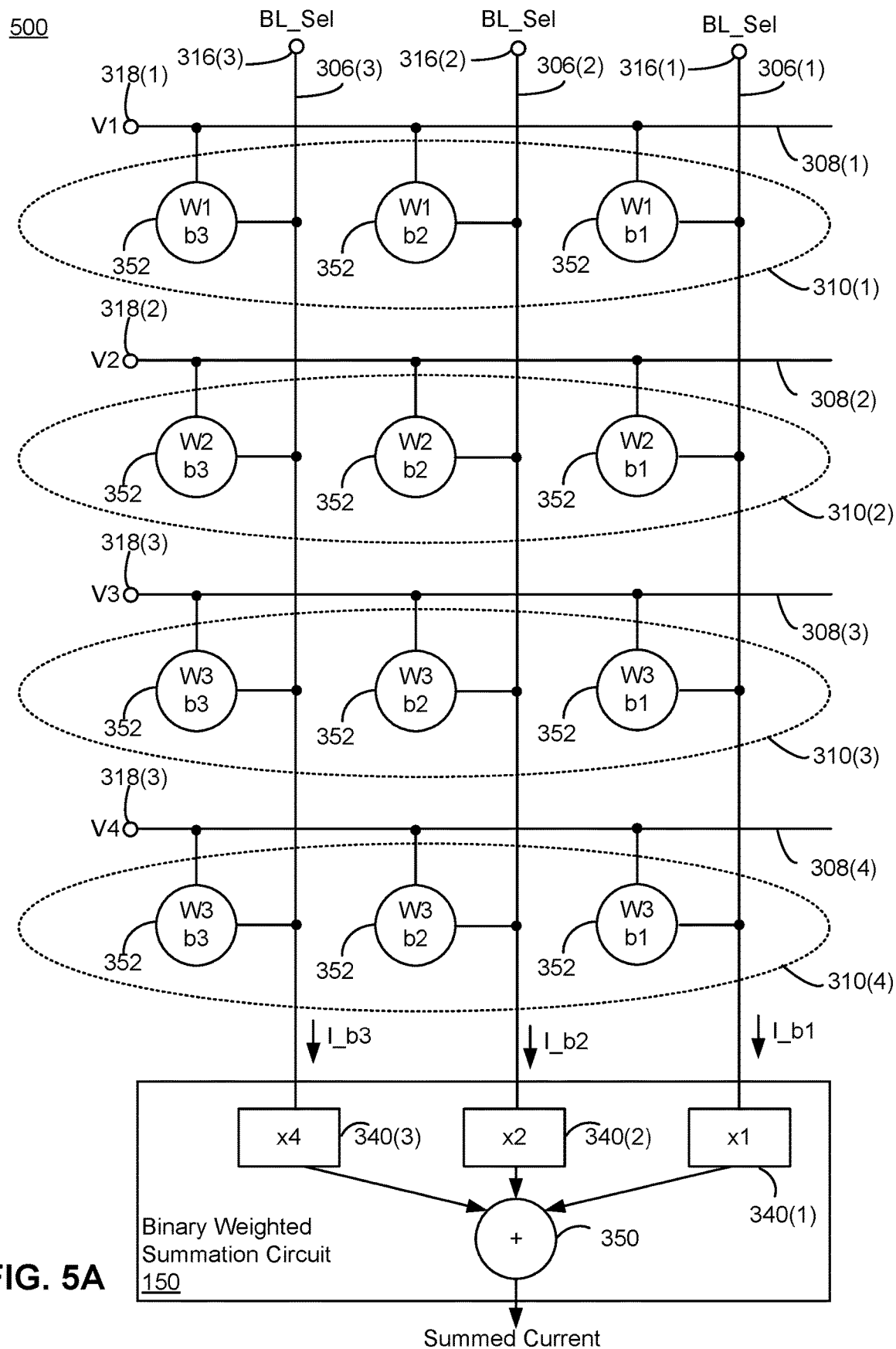
FIG. 5A shows one embodiment of an apparatus having a cross-point array with two-terminal devices that may be used to perform vector/vector multiplication.

One embodiment may be used to perform vector/vector multiplication (e.g., dot product). FIG. 5A shows one embodiment of an apparatus 500 having a cross-point array with a column of nodes 310(1), 310(2), 310(3), and 310(4). The memory cells 352 in FIG. 5A are two-terminal memory cells. The two-terminal memory cells depicted in FIG. 4A could be used, but other two-terminal memory cells could also be used. The reference numeral 310 will be used to refer to one or more nodes without reference to a specific node. For ease of explanation, each node 310 has three memory cells 352 as in the embodiment depicted in FIG. 3A. In general, each node 310 has two or more memory cells 352. Each node 310 has the same number of memory cells, in one embodiment. Each memory cell 352 is programmed to one of two states, in one embodiment.

Each node 310 may store a different weight, in the example of FIG. 5A. Node 310(1) stores weight W1, node 310(2) stores weight W2, node 310(3) stores weight W3, and node 310(4) stores weight W4. As with the example of FIGS. 3A and 3B, the memory cells 352 in a node collectively store a multiplicand. The weights in the column of nodes 310 may be considered to be a vector of "n" elements. For the sake of discussion, this vector will be referred to as a "weight vector." The weights may be used for the weights of synapses in a neural network 200. More generally, the nodes 310 are not required to store weights, but may store any multiplicand.

A voltage is applied to each of the first conductive lines 308(1), 308(2), 308(3), 308(4). Moreover, these voltages may be applied to the first conductive lines simultaneously. The magnitudes of the set of voltages (V1, V2, V3, V4) may be considered to represent a vector of "n" elements. For the sake of discussion this vector will be referred to as an "input vector". The input vector represents input neurons 202 of a neural network, in one embodiment. The set of voltages are examples of "vector element voltages." Each of the memory cells 352 in a node 310 receives the same vector element voltage, in one embodiment. Each memory cell 352 passes a current to the second conductive line 306 connected to that memory cell in response to the voltage applied to that memory cell 352, in one embodiment. Each memory cell 352 causes a current in the second conductive line 306 connected to that memory cell in response to the voltage applied to that memory cell 352, in one embodiment. The currents from each memory cell connected to the same second conductive line will combine (given that the set of voltages (V1, V2, V3, V4) are applied simultaneously. Thus, each second conductive line 306 will have a "result current." Second conductive line 306(1) has result current I_b1. Second conductive line 306(2) has result current I_b2. Second conductive line 306(3) has result current I_b3.

In FIG. 5A, the set of voltages (V1, V2, V3, V4) are depicted as being applied to the first conductive lines 308(1), 308(2), 308(3), 308(4) for ease of explanation. For the sake of illustration, the voltages "BL_Sel" may be considered to be "0V", in the example of FIG. 5A. However, the BL_Sel voltages are not required to be "0V". As noted above, applying a multiply voltage to a memory cell 352 refers to applying the multiply voltage across two terminals of the memory cell. Thus, each voltage (V1, V2, V3, V4) is applied between one of the first conductive lines 308 and a second conductive line 306, in one embodiment.

The binary weighted summation circuit 150 multiplies each of the memory cell currents by a different power of two. This is similar to the example in FIG. 3A, and will therefore not be discussed in detail. The summer 350 sums the multiplied memory cell currents, and outputs a summed current. The summed current may be referred to herein as a "vector multiplication result signal." The magnitude of the vector multiplication result signal represents a result of vector multiplication. In one embodiment, the magnitude of the summed current represents a vector dot product of the input vector and the weight vector.

Figure 5B:
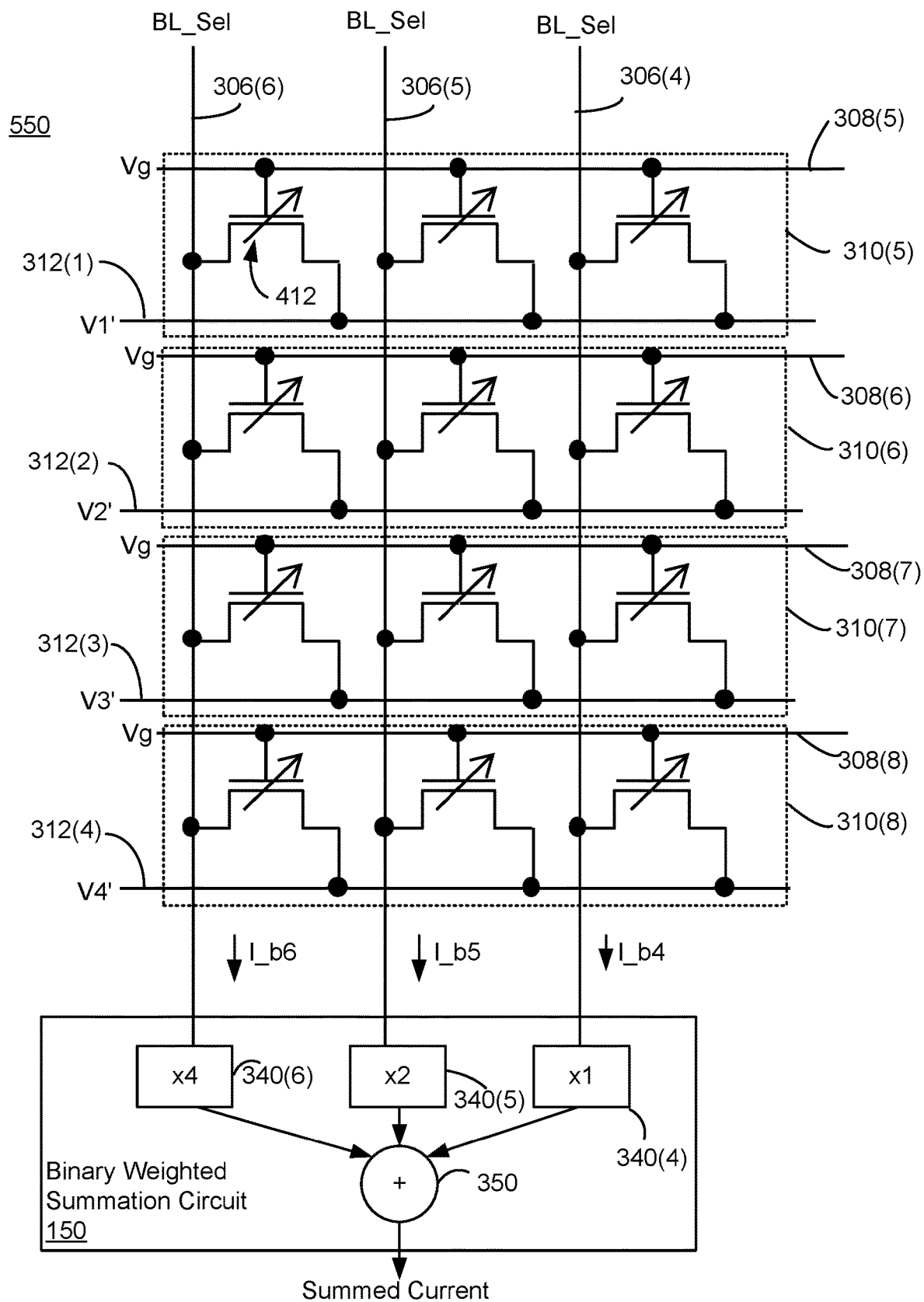
FIG. 5B shows one embodiment of an apparatus having a cross-point array with three-terminal devices that may be used to perform vector/vector multiplication.

FIG. 5B shows one embodiment of apparatus 550 having a cross-point array with a column of nodes 310(5), 310(6), 310(7), and 310(8). Each node 310 may store a different weight, as has been discussed in the example of FIG. 5A. The array 550 of FIG. 5B may be used to perform vector/vector multiplication, similar to the array 500 of FIG. 5A. However, the memory cells 352 in FIG. 5B are three-terminal memory cells. Each memory cell has an adjustable Vt transistor 412. FIG. 4B depicts a three-terminal memory cell with an adjustable Vt transistor 412 that may be used in the array 550 of FIG. 5B.

A voltage (V1', V2', V3', V4') is applied to each of the third conductive lines 312(1), 312(2), 312(3), 312(4). Moreover, these voltages may be applied to the third conductive lines 312 simultaneously. A voltage Vg is applied to each of the first conductive lines 308(5), 308(6), 308(7), and 308(8). A bit line select voltage (BL_Sel) is applied to each of the second conductive lines 306(4), 306(5), and 306(6). In one embodiment, the multiply voltage is defined as the difference between the voltage on the first conductive line 308 and the third conducive line 312 connected to a memory cell. The applied voltages result in current I_b4 in second conductive line 306(4), current I_b5 in second conductive line 306(5), and current I_b6 in second conductive line 306(6). The binary weighted summation circuit 150 multiplies (using multipliers 340(4), 340(5), and 340(6)) and sums these currents in a similar manner as the circuit of FIG. 5A.

Figure 6:
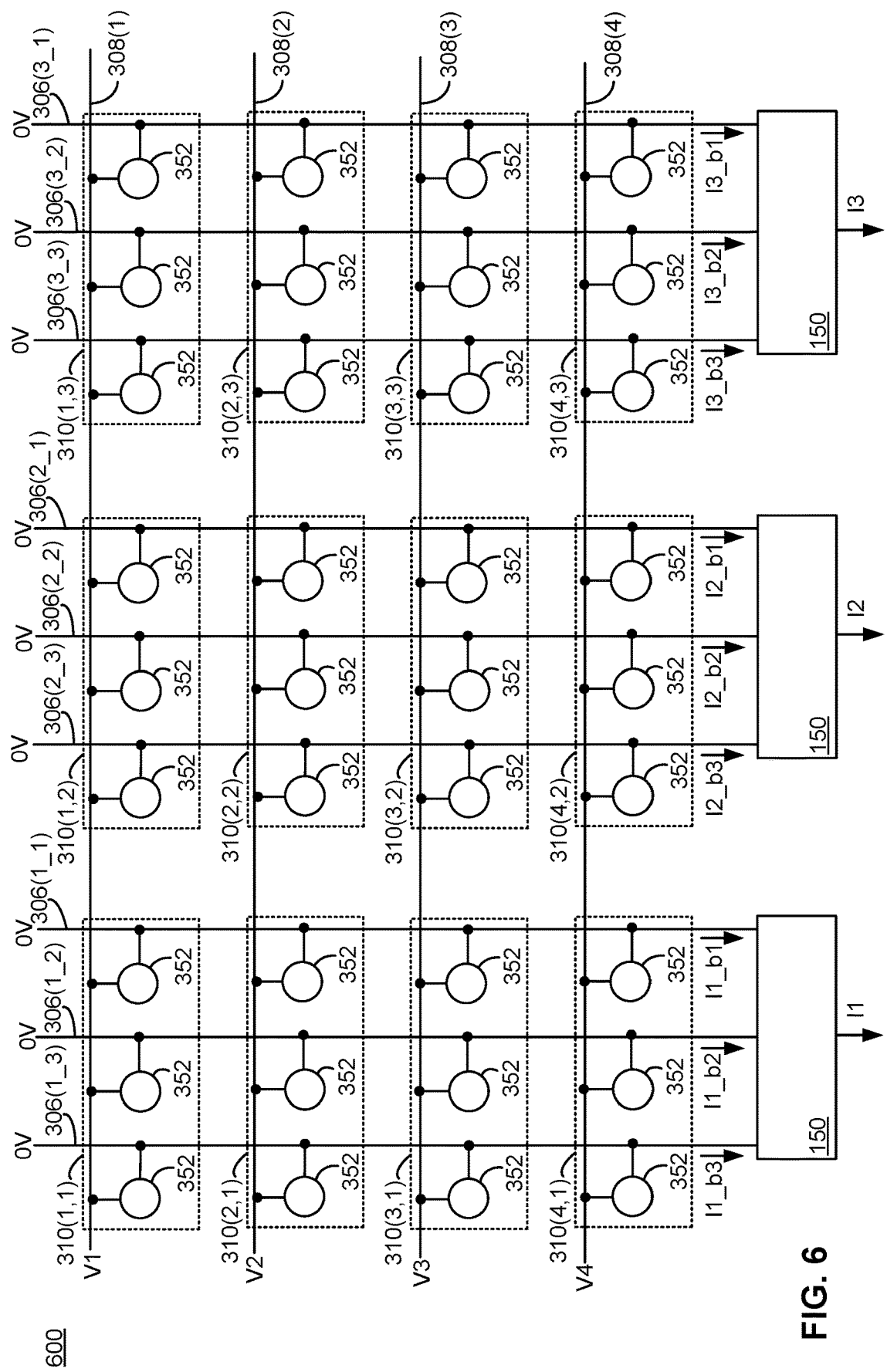
FIG. 6 is diagram that depicts a portion of one embodiment of a non-volatile memory array, which may be used to perform vector/matrix multiplication.

In the examples of FIGS. 5A and 5B, one column of nodes 310 is used for vector/vector multiplication. In one embodiment, a non-volatile memory array is used to perform vector/matrix multiplication. Additional columns of nodes 310 can be added (with the same first conductive lines 308) to perform vector/matrix multiplication. FIG. 6 is diagram that depicts a portion of one embodiment of a non-volatile memory array 600, which may be used to perform vector/matrix multiplication. A portion of a cross-point array is depicted in FIG. 6. There are three columns of nodes 310, with each column having four nodes. Each column may be used to perform vector/vector multiplication.

A first column of nodes includes nodes 310(1,1), 310(2,1), 310(3,1) and 310(4,1). The first column is associated with second conductive lines 306(1_1), 306(1_2), and 306(1_3). A second column of nodes includes nodes 310(1,2), 310(2, 2), 310(3,2) and 310(4,2). The second column is associated with second conductive lines 306(2_1), 306(2_2), and 306(2_3). A third column of nodes includes nodes 310(1,3), 310(2,3), 310(3,3) and 310(4,2). The third column is associated with second conductive lines 306(3_1), 306(3_2), and 306(3_3). In this example, 0V is applied to each second conductive line 306 as a select voltage. However, the select voltage could have a different magnitude.

For ease of explanation, the same first conductive lines 308(1), 308(2), 308(3), 308(4) from FIG. 5A are depicted in FIG. 6. Also, for ease of explanation, the same voltages (V1, V2, V3, V4) are applied to the first conductive lines 308. As in the example of FIG. 5A, the set of voltages may represent an "input vector." However, a different set of nodes 310 are depicted in FIG. 6, that those shown in FIG. 5A. Each of the memory cells 352 in FIG. 6 is programmed to either a first state or a second state, in one embodiment. As with previous example, each node 310 collectively stores a multiplicand. Collectively, the nodes 310 may be used to store values for an "n×m" matrix. In one embodiment, the nodes 310 store an "n×m" array of weights for a neural network. In the example of FIG. 6, n=4 and m=3.

Each column may be used for vector/vector multiplication. This may be similar to vector/vector multiplication as discussed with respect to one embodiment of FIG. 5A, and hence will not be described in detail. Briefly, second conductive line 306(1_1) has result current I1_$b$1, second conductive line 306(1_2) has result current I1_$b$2, and second conductive line 306(1_3) has result current I1_$b$3. The binary weighted summation circuit 150 multiplies each of the result currents by a different power of two. The binary weighted summation circuit 150 also sums the multiplied result currents, and outputs a summed current (I1), which represents a result of vector/vector multiplication.

Briefly, second conductive line 306(2_1) has result current I2_$b$1, second conductive line 306(2_2) has result current I2_$b$2, and second conductive line 306(2_3) has result current I2_$b$3. The binary weighted summation circuit 150 multiplies each of the result currents by a different power of two. The binary weighted summation circuit 150 also sums the multiplied result currents, and outputs a summed current (I2), which represents a result of vector/vector multiplication.

Briefly, second conductive line 306(3_1) has result current I3_$b$1, second conductive line 306(3_2) has result current I3_$b$2, and second conductive line 306(3_3) has result current I3_$b$3. The binary weighted summation circuit 150 multiplies each of the result currents by a different power of two. The binary weighted summation circuit 150 also sums the multiplied result currents, and outputs a current (I3), which represents a result of vector/vector multiplication.

Collectively, summed currents I1, I2, I3 represent a result of vector/matrix multiplication. In one embodiment, each of the individual summed currents represents an output neuron 206 of a neural network. Because one node 310 in each column is connected to the same first conductive line 308, the vector/matrix multiplication is very efficient. Essentially, a number of vector/vector multiplications may be performed in parallel.

The number of memory cells 352 per node 310 may vary depending on the application. In one embodiment, the nodes 310 are used during a learning operation in an artificial neural network. In a learning operation it may be desirable to have more memory cells 352 per node 310 for high accuracy. For example, there might be six memory cells 352 per node 310 for a learning operation. In one embodiment, the nodes 310 are used during an inference operation in an artificial neural network. In an inference operation fewer memory cells 352 per node 310 may suffice. For example, there might be two memory cells 352 per node 310 for a learning operation. In one embodiment, the nodes 310 are used for both a learning operation and an inference operation. In this case, it may be acceptable to truncate the weights that were learned during the learning operation, wherein some of the memory cells in the node are not used during the inference operation, in one embodiment. However, all memory cells in the node could be used for both learning the weights and using the weights in the inference operation.

Figure 7:
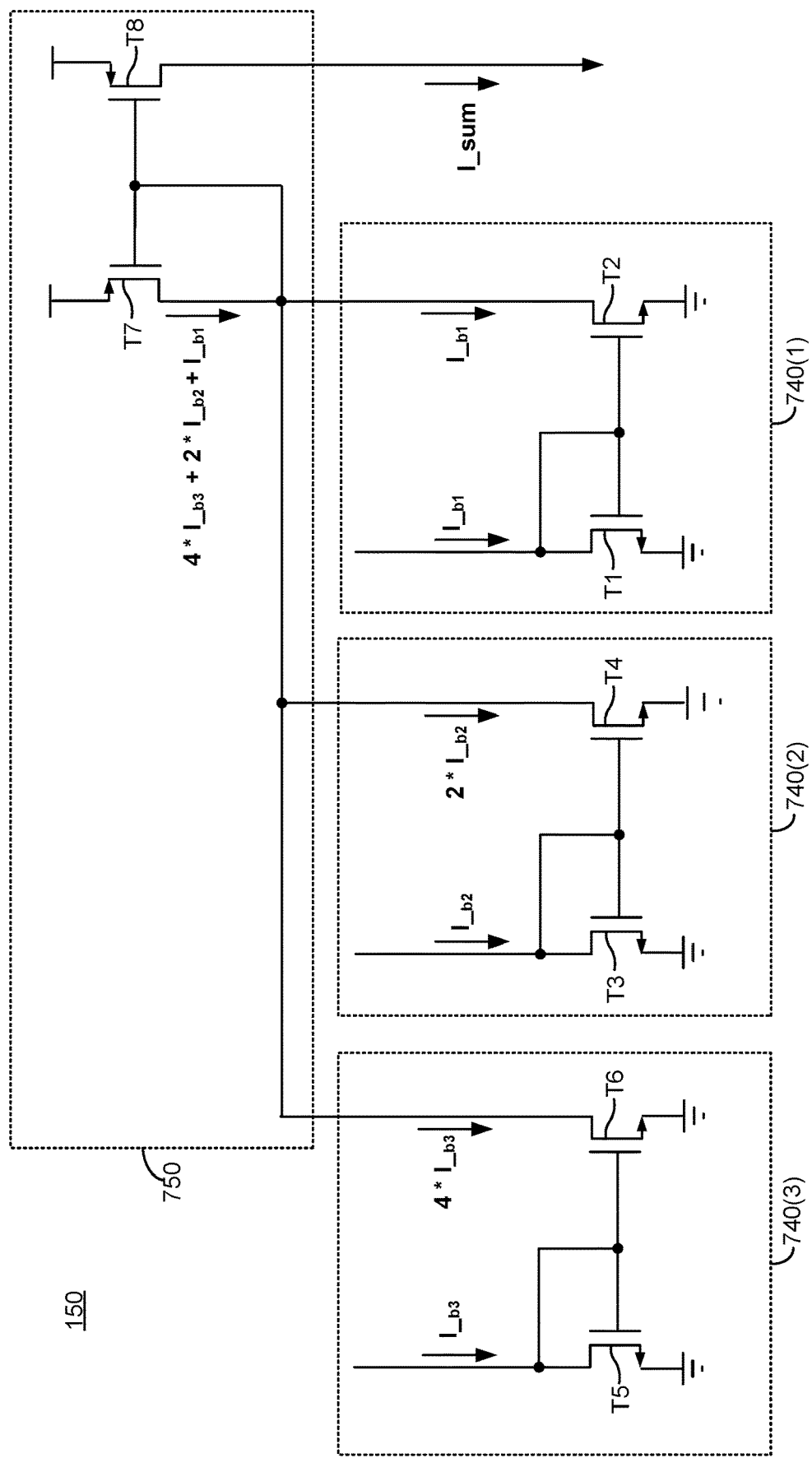
FIG. 7 is a schematic diagram of one embodiment of the binary weighted summation circuit.

FIG. 7 is a schematic diagram of one embodiment of the binary weighted summation circuit 150. The circuit 150 will be explained with respect to the binary weighted summation circuit 150 in FIG. 5A, but is not limited to FIG. 5A. The circuit 150 of FIG. 7 has a first multiply current mirror 740(1) that may be used to implement multiplier 340(1), second multiply current mirror 740(3) that may be used to implement multiplier 340(2), and third multiply current mirror 740(3) that may be used to implement multiplier 340(3). The circuit 150 of FIG. 7 has a summing current mirror 740(4) that may be used to implement summer 350.

The first, second, and third multiply current mirrors 740(1), 740(2) and 740(3) each receive a current from one of the second conductive lines 306 associated with a column of nodes 310. The second conductive lines 306 and associated nodes 310 are not depicted in FIG. 7. With reference to FIG. 5A, the second conductive lines 306 are lines 306(1), 306(2), and 306(3). With reference to FIG. 5A, the associated nodes are nodes 310(1), 310(2), 310(3), and 310(4). Note that each of these nodes 310 in a column is associated with the same "r" bit lines, where in this example "r" is three.

Returning again to FIG. 7, the first multiply current mirror 740(1) has transistor T1 and transistor T2. The second current mirror 740(2) has transistor T3 and transistor T4. The third current mirror 740(3) has transistor T5 and transistor T6. The fourth current mirror 740(4) has transistor T7 and transistor T8. In one embodiment, transistors T1, T2, T3, T5, T7, and T8 are each the same size. Transistors T1, T2, T3, T5, T7, and T8 each have the same width-to-length ratio (W/L), in one embodiment. However, transistor T4 may have twice the W/L of transistors T1, T2, T3, T5, T7, and T8. Further, transistor T6 may have four times the W/L of transistors T1, T2, T3, T5, T7, and T8.

Transistor T1 in multiply current mirror 740(1) receives a current "I_b1". Transistor T1 is connected to one of the second conductive lines in order to receive current "I_b1". For example, with respect to FIG. 5A, transistor T1 may be connected to second conductive line 306(1). Due to the current mirror configuration, the current "I_b1" in transistor T1 is mirrored to transistor T2. Thus, the first current mirror 740(1) multiplies the current "I_b1" by "1".

Transistor T3 in multiply current mirror 740(2) receives a current "I_b2". Transistor T3 is connected to one of the second conductive lines in order to receive current "I_b2". For example, with respect to FIG. 5A, transistor T3 may be connected to second conductive line 306(2). As noted above, the W/L of transistor T4 is twice that of transistor T3, in one embodiment. Due to the current mirror configuration, the current in transistor T4 is 2*I_b2. Thus, due to the current mirror configuration, the current "I_b2" from the second conductive line is multiplied by two. Thus, the second current mirror 740(2) multiplies the current "I_b2" by "2".

Transistor T5 in multiply current mirror 740(3) receives a current "I_b3". Transistor T5 is connected to one of the second conductive lines in order to receive current "I_b3". For example, with respect to FIG. 5A, transistor T5 may be connected to second conductive line 306(3). As noted above, the W/L of transistor T6 is four times that of transistor T5, in one embodiment. Due to the current mirror configuration, the current in transistor T6 is 4*I_b3. Thus, due to the current mirror configuration, the current "I_b3" from the second conductive line is multiplied by four. Thus, the third current mirror 740(3) multiplies the current "I_b3" by "4".

Transistor T7 in the summing current mirror 750 is connected to transistors T2, T4, and T6. Therefore, transistor T7 receives the combined currents from transistors T2, T4, and T6. The current from transistor T7 is mirrored to transistor T8. Thus, the current in transistor T8 is given by Equation 2.

$$I\_sum = 4*I\_b3 + 2*I\_b2 + I\_b1 \qquad \text{Eq. 2}$$

Multiply current mirrors 740(1), 740(2), and 740(3) multiply their respective currents (from the second conductive lines 306) while summing current mirror 740(4) sums the multiplied results from current mirrors 740(1), 740(2), and 740(3), and outputs I_sum. Thus, I_sum can be produced without delays that could otherwise be incurred by converting the currents I_b1, I_b2, and I_b3 to digital signals, in order to process the currents.

The binary weighted summation circuit 150 can be designed to reduce the impacts of noise and/or distortion to an acceptable level. The level of noise that is acceptable will depend on the application. One technique to reduce the impact of noise and/or distortion is to increase the size of the transistors T1-T8. For example, the length of the transistors T1-T8 can be increased to decrease the impact of noise.

Figure 8:
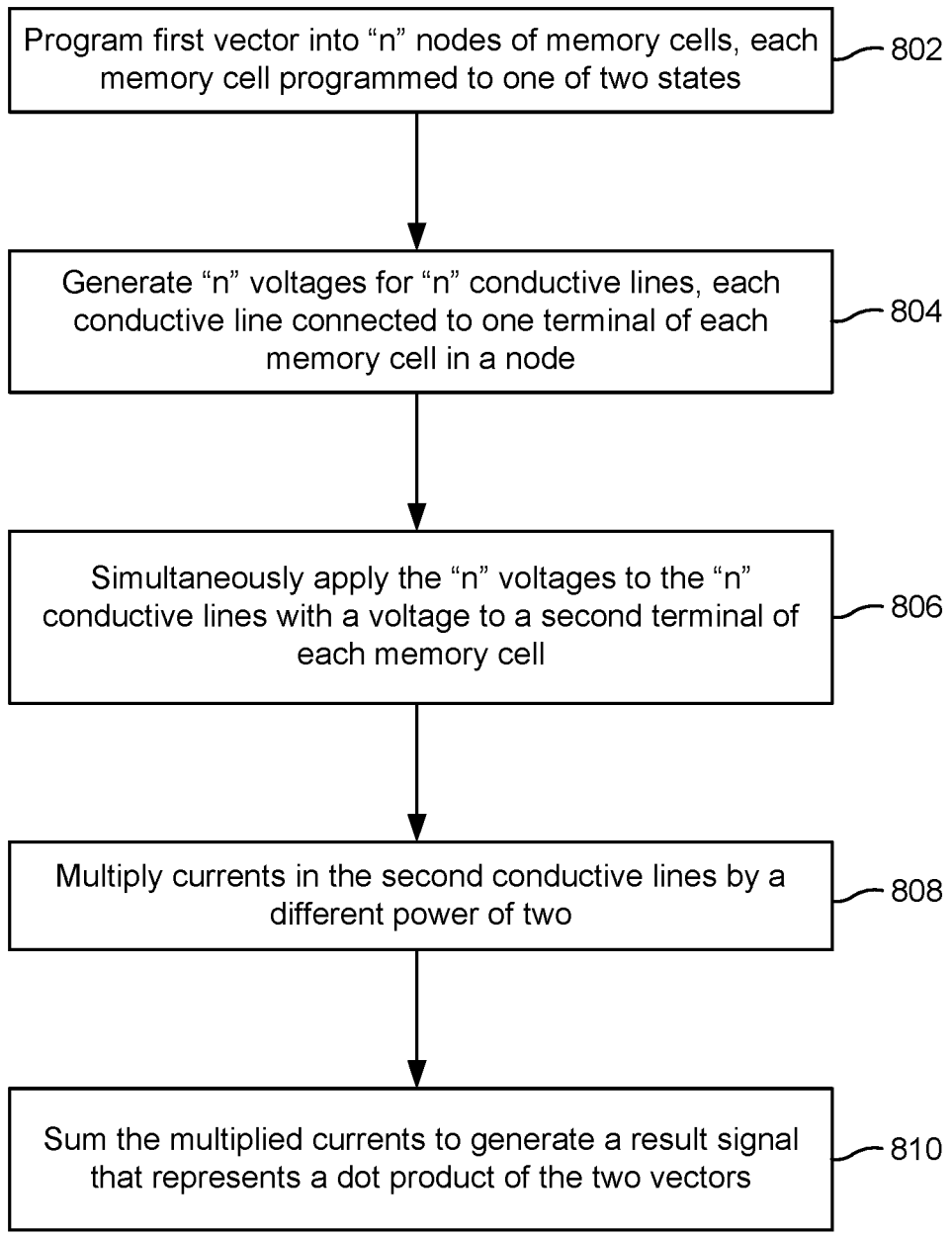
FIG. 8 is a flowchart of one embodiment of a process or multiplying two vectors using non-volatile memory cells.

FIG. 8 is a flowchart of one embodiment of a process 800 or multiplying two vectors using non-volatile memory cells. Process 800 will be described with reference to FIG. 5A, but is not limited to that embodiment. Process 800 may also be performed in the apparatus of FIG. 5B or 6. Process 800 could use any of the memory cells in FIG. 4A, 4B, or 4C, but is not limited to those memory cells.

Step 802 includes programming a first vector having "n" elements into a corresponding "n" nodes 310 of non-volatile memory cells 352. Each node 310 is electrically connected to a different one of "n" first conductive lines 308. Thus, each memory cell 352 in a node 310 is electrically connected to the same first conductive line 308. In one embodiment, each node 310 is electrically connected to a different one of "n" third conductive lines 312. Each node 310 has "r" memory cells 352, with each memory cell in a given node 310 electrically connected to a different one of "r" second conductive lines 306. In one embodiment, each element of the first vector is represented as "r" bits. Each memory cell 352 is programmed to one of two states, in one embodiment. In one embodiment, the two states are a low resistance (or high conductance) state and a high resistance (or low conductance) state. In one embodiment, the two states are a low Vt state and a high Vt state. The two states are a high current (or on) state, and a low current (or off) state, in one embodiment.

As noted herein, each element of the first vector that is programmed into the memory cells 352 may be represented as "r" bits. The first vector might initially be represented by any type of information, such as "n" analog signals or "n" digital signals. If the first vector is initially represented by analog signals, then step 802 may include converting the analog signal to digital signals. Thus, step 802 could include digitizing the initial information that represents the first vector to a resolution of "r" bits.

In one embodiment, the first vector is a set of "n" weights in a neural network 200. The weights may initially be analog values that are digitized to a resolution of "r" bits. One weight may be stored into each node 310, with each memory cell 352 in the node storing one bit of the weight. Each memory cell 352 may be programmed to one of two states to represent the bit.

Step 804 includes generating "n" voltages for "n" conductive lines. Each of the conductive lines is connected to one terminal of each memory cell in one node 310. Depending on the implementation, these "n" voltages might be for the first conductive line 308 (e.g., word line) or the third conductive line 312 (e.g., source line). Step 804 may also include generating voltages for the other conductive lines. In some embodiments, these other voltages are fixed voltages. The magnitudes of these "n" voltages is such that when the "n" voltages are applied to a conductive line along with a voltage applied to another conductive line, a multiply voltage is applied to a memory cell. A magnitude of each multiply voltage represents a magnitude of one of "n" elements of a second vector. Thus, the magnitudes of the "n" voltages are based on the "n" elements of the second vector.

Step 806 includes simultaneously applying the "n" voltages to a corresponding "n" conductive lines with a voltage to a second terminal of each memory cell. With reference to FIG. 5A, the "n" voltages are simultaneously applied to first conductive lines 308(1), 308(2), 308(3), and 308(4). Also, BL_sel is applied to the second conductive lines 306, resulting in multiply voltages applied to each memory cell. With reference to FIG. 5B, the "n" voltages are simultaneously applied to third conductive lines 312(1), 312(2), 312(3), and 312(4). Also, Vg is applied to the first conductive lines 308 resulting in multiply voltages applied to each memory cell. In each case, each memory cell may pass a current to the second conductive line 306 that is connected to that memory cell.

Step 808 includes multiplying the currents in the second conductive lines 306 by a different power of two. With reference to FIG. 4, I_b1 in second conductive line 306(1) is multiplied by one by multiplier 340(1); I_b2 in second conductive line 306(2) is multiplied by two by multiplier 340(2); and I_b3 in second conductive line 306(3) is multiplied by four by multiplier 340(3).

Step 810 includes summing the multiplied currents to generate a result that represents a dot product of the first vector by the second vector. With reference to FIG. 5A, the summer 350 sums the three multiplied currents.

In one embodiment, steps 808 and 810 are performed simultaneously. In one embodiment, the analog circuit in FIG. 7 is used to perform steps 808 and 810 simultaneously. By "simultaneously" it is meant that current mirrors 740(1), 740(2), and 740(3) multiply their respective currents (from the second conductive lines 306) while current mirror 740(4) sums the multiplied results from current mirrors 740(1), 740(2), and 740(3), and outputs I_sum. Simultaneously operation does not mean that I_sum will necessarily instantaneously track the currents in the second conductive lines 306, as there may be some small time for the currents to be reflected by the current mirrors.

However, the simultaneous performance of steps 808 and 810 is much faster than first converting the analog currents in the second conductive lines 306 to digital values (with, for example, an analog to digital converter), and then multiplying the digital values (with, for example, a shift register), followed by summing the multiplied digital values. For many systems, such as neuromorphic computing systems, the increased speed provided by the circuit of FIG. 7 provides a significant increase in performance.

In one embodiment, the current I_sum that is generated in step 810 is converted to a digital value. This digital value represents the dot product of the two vectors, in one embodiment. If process 800 is being used to implement an artificial neural network, the digital value could be input to an activation function.

Figure 9:
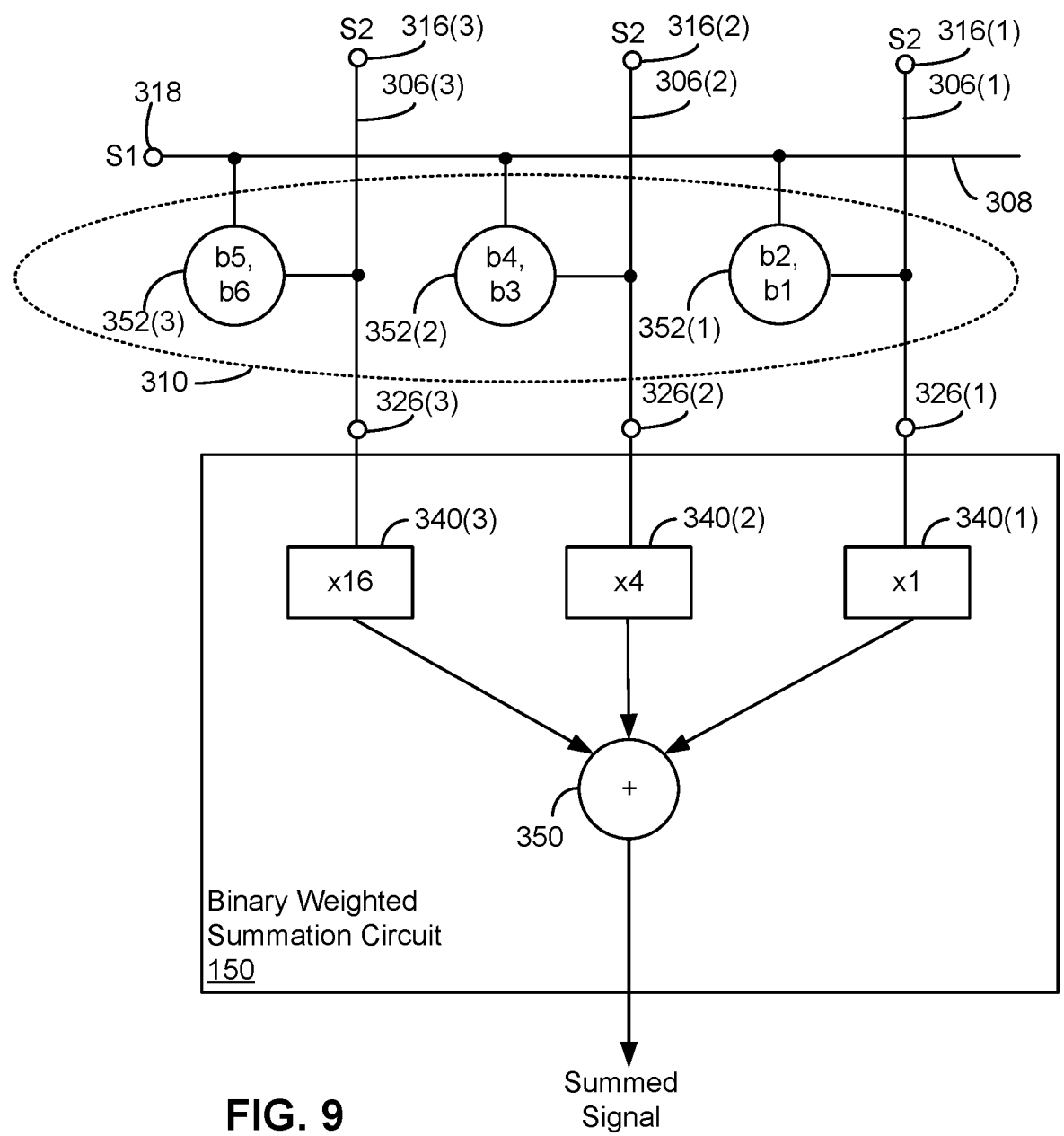
FIG. 9 depicts one embodiment of an array in which the memory cells each store two bits of a multiplicand.

Numerous examples have been provided herein in which the memory cells 352 in a node 310 are programmed to one of two physical states. In some embodiments, the memory cells 352 in a node 310 are programmed to one of four or more physical states. Hence, each memory cell 352 may store two or more bits of a multiplicand, in some embodiments. FIG. 9 depicts one embodiment of an array 900 in which the memory cells 352 each store two bits of a multiplicand. In this example, the multiplicand has a resolution of six bits. Bits 1 and 2 are stored in memory cell 352(1), bits 3 and 4 are stored in memory cell 352(2), and bits 5 and 6 are stored in memory cell 352(3).

Each memory cell 352 in FIG. 9 may be programmed to one of four different physical states (e.g., resistance, Vt). For ease of discussion these four states will be referred to as "00," "01," "10," and "11." Each physical state is associated with a memory cell current. For the sake of discussion these currents will be referred to as $I_{00}$, $I_{01}$, $I_{10}$, and $I_{11}$. The magnitudes of the currents increase in the sequence $I_{00}$, $I_{01}$, $I_{10}$, $I_{11}$, in one embodiment. In one embodiment, there is a linear relationship between the magnitudes of these four currents.

Operation of the array 900 of FIG. 9 may be similar to the array 300 of FIG. 3A. The binary weighted summation circuit 150 multiplies the current in second conductive line 306(1) by 1, in this embodiment. The binary weighted summation circuit 150 multiplies the current in second conductive line 306(2) by 4, in this embodiment. The binary weighted summation circuit 150 multiplies the current in second conductive line 306(3) by 16, in this embodiment. Thus, the binary weighted summation circuit 150 multiples each current by a different power of two.

The resolution can be increased by adding more memory cells 352 to the node 310. Also, each memory cell could store three or more bits. The various arrays depicted in FIGS. 3B, 5A, 5B, and 6 may also be used to store two or more bits per memory cell 352.

A first embodiment includes an apparatus, comprising one or more nodes of non-volatile memory cells, a multiply circuit, and a binary weighted summation circuit. The multiply circuit is configured to simultaneously apply a multiply voltage to each non-volatile memory cell in a selected node. Each memory cell in the selected node passes a memory cell current in response to the multiply voltage. A magnitude of the memory cell current depends on a magnitude of the multiply voltage and which physical state the memory cell is in. The magnitude of the multiply voltage represents a multiplier. The binary weighted summation circuit is configured to multiply a magnitude of the memory cell current from each memory cell in the selected node by a different power of two to produce a multiplied signal for each memory cell, and sum the multiplied signals for the selected node to generate a summed signal that represents a product of the multiplier times a multiplicand stored in the selected node.

In a second embodiment, in furtherance of the first embodiment, the binary weighted summation circuit is configured to simultaneously multiply the magnitude of the memory cell current from each memory cell in the selected node and sum the multiplied signals for the selected node.

In a third embodiment, in furtherance of the first or second embodiments, the apparatus further comprises a write circuit configured to store one of "r" bits of the multiplicand into each memory cell in the selected node.

In a fourth embodiment, in furtherance of any of the first to third embodiments, the binary weighted summation circuit comprises multiply current mirrors. Each multiply current mirror produces a multiplied replica of one of the memory cell currents in order to generate one of the multiplied signals. The binary weighted summation circuit further comprises a summing current mirror configured to combine the multiplied replicas from each of the multiply current mirrors to produce the summed signal.

In a fifth embodiment, in furtherance of any of the first to fourth embodiments, the binary weighted summation circuit is configured to: convert the magnitude of the memory cell current from each memory cell into a digital value, and multiply each digital value by one of the different powers of two to generate each multiplied signal. The binary weighted summation circuit is configured to sum the multiplied digital values to generate the summed signal.

In a sixth embodiment, in furtherance of any of the first to fifth embodiments, the apparatus further comprises a first conductive line connected to each of the non-volatile memory cells in the selected node. The apparatus further comprises a plurality of second conductive lines. Each second conductive line is connected to one memory cell in the selected node. The multiply circuit is configured to apply the multiply voltage between the first conductive line and each second conductive line in order to simultaneously apply the multiply voltage to each non-volatile memory cell in the selected node. The memory cell current of each non-volatile memory cell in the selected node passes to the second conductive line associated with the memory cell.

In a seventh embodiment, in furtherance of any of the first to sixth embodiments, the one or more nodes comprise "n" nodes of memory cells, the selected node being one of the "n" nodes. Further, the multiply circuit is configured to simultaneously apply "n" different multiply voltages to the "n" nodes. Each of the n" different multiply voltages having a magnitude that represents one element of a first vector having "n" elements. The binary weighted summation circuit is further configured to generate a result signal that represents a product of the first vector times a second vector stored in the "n" nodes of non-volatile memory cells.

In an eighth embodiment, in furtherance of the seventh embodiment, the one or more nodes comprise "m" sets of the "n" nodes of memory cells. The binary weighted summation circuit is further configured to generate a matrix multiplication result that represents a product of the first vector and a matrix stored in the "m" sets of the "n" nodes of non-volatile memory cells.

One embodiment includes a non-volatile memory system, comprising: "n" nodes, each comprising "r" non-volatile memory cells; "r" bit lines, each bit line associated with one memory cell in each of the "n" nodes; and one or more control circuits in communication with the "n" nodes of non-volatile memory cells and the "r" bit lines. The one or more control circuits are configured to simultaneously apply "n" vector element voltages to the respective "n" nodes. Each memory cell in a node receives the same vector element voltage. Each non-volatile memory cell causes a current in its associated bit line in response to the vector element voltage applied to that memory cell. A magnitude of each vector element voltage represents a magnitude of one of "n" elements of a first vector. The one or more control circuits are configured to multiply the current in each bit line by a different power of two. The one or more control circuits are configured to sum the multiplied currents in the "r" bit lines to generate a vector multiplication result signal that represents multiplication of the first vector by a second vector stored in the "n" nodes of non-volatile memory cells.

One embodiment includes a method of performing vector/vector multiply. The method comprises programming a plurality of non-volatile memory cells to one of a first state and a second state. The plurality of non-volatile memory cells comprise "n" nodes that each are programmed with one element of a first vector. Each of "n" first conductive lines is connected to a first terminal of each memory cell in a node. Each node has "r" memory cells each connected to one of "r" second conductive lines. The method comprises generating "n" first voltages, wherein a magnitude of each of the "n" first voltages is based on a magnitude of one of "n" elements of a second vector. The method comprises simultaneously applying the "n" first voltages to corresponding ones of the "n" first conductive lines while applying a second voltage to a second terminal of each memory cell. The method comprises multiplying, by a different power of two, a current in each of the "r" second conductive lines that results from simultaneously applying the n" first voltages and the voltage to the second terminals. The method comprises summing each of the multiplied currents to generate a result that represents a dot product of the first vector by the second vector.

One embodiment includes a non-volatile memory system, comprising "n" first conductive lines, and a plurality of nodes of binary non-volatile memory cells. The nodes comprise "n" rows of nodes and "m" columns of nodes that form an "n×m" array of nodes. Each node comprises "r" memory cells. Memory cells in each of the "n" rows are connected to one of the "n" first conductive lines. The non-volatile memory system further comprises "m×r" second conductive lines. Each memory cell is connected to one of the "m×r" second conductive lines. Each of the "m" columns of nodes is associated with the same "r" second conductive lines. The non-volatile memory system comprises a write circuit configured to store elements of an "n×m" matrix into corresponding ones of the "n×m" array of nodes. The write circuit is configured to program each memory cell to one of two states. The non-volatile memory system comprises a multiply circuit configured to simultaneously apply each of "n" multiply voltages between one of the "n" first conductive lines and one of the "m×r" second conductive lines. Each binary non-volatile memory cell provides a current to its associated second conductive line in response to the multiply voltage applied to that memory cell. A magnitude of each multiply voltage represents a magnitude of one of "n" elements of a vector. The non-volatile memory system comprises a binary weighted summation circuit configured to multiply, for each of the "m" columns, the current in each of the "r" second conductive lines associated with the column by a different power of two. The binary weighted summation circuit is further configured to sum, for each of the "m" columns, the multiplied "r" second conductive line currents. Wherein "m" currents are generated by the binary weighted summation circuit. The "m" currents represent a result a multiplication of the vector by the "n×m" matrix.

One embodiment includes a non-volatile memory system comprising "n" first conductive lines, and "n×m" nodes of non-volatile memory cells. Each node comprises "r" memory cells, with "m" nodes connected to each of the "n" first conductive lines. The "n×m" nodes of non-volatile memory cells form an "n×m" array of nodes. The non-volatile memory system further comprises "m×r" second conductive lines. Each second conductive line is associated with one memory cell in "n" nodes that are connected to different first conductive lines, with "n" nodes of memory cells associated with the same "r" second conductive lines, and "n" nodes of memory cells associated with the same "r" second conductive lines forming a column of the "n×m" array of nodes. The non-volatile memory system further comprises write means for storing a weight into each of the "n×m" nodes of non-volatile memory cells. The write means for writing either a "1" or a "0" to each of the non-volatile memory cells. The weights represent an "n×m" matrix of weights. The non-volatile memory system comprises voltage generation means for generating "n" first voltages for the "n" first conductive lines and a second voltage for the "m×r" second conductive lines. A difference between each of the "n" first voltages and the second voltage corresponds to "n" multiply voltages. A magnitude of each multiply voltage represents a magnitude of one of "n" elements of a second vector. The non-volatile memory system comprises voltage application means for simultaneously applying the "n" first voltages to corresponding ones of the "n" first conductive lines while applying the second voltage to the "m×r" second conductive lines. Each of the non-volatile memory cells passes a current to its associated second conductive line in response to the multiply voltage applied to that memory cell. The non-volatile memory system comprises current multiplying means for multiplying, for each column of the "n×m" array of nodes, the current in each of the "r" second conductive lines associated with that column by a different power of two. The non-volatile memory system comprises current summation means for summing, for each column of the "n×m" array of nodes, the multiplied "r" second conductive line currents for the respective column, wherein "m" currents are generated by the current summation means, wherein the "m" currents represent a result of multiplication of the vector by the "n×m" matrix of weights.

In one embodiment, the write means comprises one or more of memory core control circuits 108, address decoders 120, voltage generators 132, voltage generators for selected control lines 132a, voltage generators for unselected control lines 132b, signal generator for reference signals 132c, transfer data latch 148, write circuit 146, state machines, page registers, control circuitry, and/or sense amplifiers. The write means may comprise other hardware and/or software.

In one embodiment, the voltage generation means comprises one or more of memory core control circuits 108, voltage generators 132, voltage generators for selected control lines 132a, voltage generators for unselected control lines 132b, multiply circuit 146, state machines, page registers, and or control circuitry. The voltage generation means may comprise other hardware and/or software.

In one embodiment, the voltage application means comprises one or more of memory core control circuits 108, address decoders 120, voltage generators 132, voltage generators for selected control lines 132a, voltage generators for unselected control lines 132b, multiply circuit 146, state machines, and/or control circuitry. The voltage application means may comprise other hardware and/or software.

In one embodiment, the current multiplying means comprises one or more of memory core control circuits 108, multiplier 340, multiply current mirror 740, analog to digital converter, and/or shift register. The current multiplying means may comprise other hardware and/or software.

In one embodiment, the current summing means comprises one or more of memory core control circuits 108, summer 350, and/or summing current mirror 750. The current summing means may comprise other hardware and/or software.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

What is claimed is:

1. An apparatus, comprising:
   one or more nodes of non-volatile memory cells;
   a multiply circuit configured to simultaneously apply a multiply voltage to each non-volatile memory cell in a selected node, wherein each memory cell in the selected node passes a memory cell current in response to the multiply voltage, wherein a magnitude of the memory cell current depends on a magnitude of the multiply voltage and which physical state the memory cell is in, wherein the magnitude of the multiply voltage represents a multiplier;
   a binary weighted summation circuit configured to:
   multiply a magnitude of the memory cell current from each memory cell in the selected node by a different power of two to produce a multiplied signal for each memory cell; and
   sum the multiplied signals for the selected node to generate a summed signal that represents a product of the multiplier times a multiplicand stored in the selected node.

2. The apparatus of claim 1, wherein:
   the binary weighted summation circuit configured to simultaneously multiply the magnitude of the memory cell current from each memory cell in the selected node and sum the multiplied signals for the selected node.

3. The apparatus of claim 1, further comprising:
   a write circuit configured to store one of "r" bits of the multiplicand into each memory cell in the selected node.

4. The apparatus of claim 1, wherein the binary weighted summation circuit comprises:
   multiply current mirrors, wherein each multiply current mirror produces a multiplied replica of one of the memory cell currents in order to generate one of the multiplied signals; and
   a summing current mirror configured to combine the multiplied replicas from each of the multiply current mirrors to produce the summed signal.

5. The apparatus of claim 1, wherein the binary weighted summation circuit is configured to:
   convert the magnitude of the memory cell current from each memory cell into a digital value, and multiply each digital value by one of the different powers of two to generate each multiplied signal; and
   sum the multiplied digital values to generate the summed signal.

6. The apparatus of claim 1, further comprising:
   a first conductive line connected to each non-volatile memory cell in the selected node; and
   a plurality of second conductive lines, each second conductive line connected to one memory cell in the selected node, the multiply circuit configured to apply the multiply voltage between the first conductive line and each second conductive line in order to simultaneously apply the multiply voltage to each non-volatile memory cell in the selected node, the memory cell current of each non-volatile memory cell in the selected node passes to the second conductive line associated with the memory cell.

7. The apparatus of claim 1, wherein:
   the one or more nodes comprise "n" nodes of non-volatile memory cells, the selected node being one of the "n" nodes;
   the multiply circuit configured to simultaneously apply "n" different multiply voltages to the "n" nodes, each of the n" different multiply voltages having a magnitude that represents one element of a first vector having "n" elements; and
   the binary weighted summation circuit is further configured to generate a result signal that represents a product of the first vector times a second vector stored in the "n" nodes of non-volatile memory cells.

8. The apparatus of claim 7, wherein:
   the one or more nodes comprise "m" sets of the "n" nodes of memory cells; and
   the binary weighted summation circuit is further configured to generate a matrix multiplication result that represents a product of the first vector and a matrix stored in the "m" sets of the "n" nodes of non-volatile memory cells.

9. A non-volatile memory system, comprising:
   "n" nodes, each comprising "r" non-volatile memory cells;
   "r" bit lines, each bit line associated with one memory cell in each of the "n" nodes; and
   one or more control circuits in communication with the "n" nodes of non-volatile memory cells and the "r" bit lines, the one or more control circuits configured to:
   simultaneously apply "n" vector element voltages to the respective "n" nodes, each memory cell in a node receives the same vector element voltage, each non-volatile memory cell causes a current in its associated bit line in response to the vector element voltage applied to that memory cell, wherein a magnitude of each vector element voltage represents a magnitude of one of "n" elements of a first vector;
   multiply the current in each bit line by a different power of two; and
   sum the multiplied currents in the "r" bit lines to generate a vector multiplication result signal that represents multiplication of the first vector by a second vector stored in the "n" nodes of non-volatile memory cells.

10. The non-volatile memory system of claim 9, wherein the one or more control circuits are further configured to:
    store the second vector in the "n" nodes of non-volatile memory cells, wherein each of the "n" nodes stores one of "n" elements of the second vector.

11. The non-volatile memory system of claim 10, wherein:
    each of the "n" elements of the second vector comprises "r" bits; and
    for each of the "n" nodes, each memory cell stores one of the "r" bits of a corresponding element of the second vector.

12. A method of performing vector/vector multiply, the method comprising:
- programming a plurality of non-volatile memory cells to one of a first state and a second state, the plurality of non-volatile memory cells comprising "n" nodes that each are programmed with one element of a first vector, each of "n" first conductive lines connected to a first terminal of each memory cell in a node, each node having "r" memory cells each connected to one of "r" second conductive lines;
- generating "n" first voltages, wherein a magnitude of each of the "n" first voltages is based on a magnitude of one of "n" elements of a second vector;
- simultaneously applying the "n" first voltages to corresponding ones of the "n" first conductive lines while applying a second voltage to a second terminal of each memory cell;
- multiplying, by a different power of two, a current in each of the "r" second conductive lines that results from simultaneously applying the n" first voltages to corresponding ones of the "n" first conductive lines while applying the second voltage to the second terminal of each memory cell; and
- summing each of the multiplied currents to generate a result that represents a dot product of the first vector by the second vector.

13. The method of claim 12, further comprising digitizing information that represents the first vector into "r" bits for each of "n" elements of the first vector, and wherein:
- programming the plurality of non-volatile memory elements comprises, for each of the "n" nodes, programming one of the "r" bits of one of the elements of the first vector into each of the non-volatile memory cells in the node.

14. The method of claim 12, wherein programming the plurality of non-volatile memory cells to one of the first state and the second state comprises:
- programming the plurality of non-volatile memory cells to one of a high conductance state and a low conductance state.

15. The method of claim 12, wherein the multiplying and the summing are performed simultaneously.

16. The method of claim 12, wherein:
- multiplying the current in each of the second conductive lines comprises converting each of the currents into a digital value, and multiplying each digital value by one of the different powers of two; and
- summing each of the multiplied currents to generate the result comprises summing the multiplied digital values to generate the result.

17. A non-volatile memory system, comprising:
"n" first conductive lines;
a plurality of nodes of binary non-volatile memory cells, comprising "n" rows of nodes and "m" columns of nodes that form an "n×m" array of nodes, each node comprising "r" memory cells, memory cells in each of the "n" rows connected to one of the "n" first conductive lines; and
"m×r" second conductive lines, each memory cell connected to one of the "m×r" second conductive lines, each of the "m" columns of nodes associated with the same "r" second conductive lines;
a write circuit configured to store elements of an "n×m" matrix into corresponding ones of the "n×m" array of nodes, the write circuit configured to program each memory cell to one of two states;
a multiply circuit configured to simultaneously apply each of "n" multiply voltages between one of the "n" first conductive lines and one of the "m×r" second conductive lines, wherein each binary non-volatile memory cell provides a current to its associated second conductive line in response to the multiply voltage applied to that memory cell, wherein a magnitude of each multiply voltage represents a magnitude of one of "n" elements of a vector; and
a binary weighted summation circuit configured to multiply, for each of the "m" columns, the current in each of the "r" second conductive lines associated with the column by a different power of two;
the binary weighted summation circuit further configured to sum, for each of the "m" columns, the multiplied "r" second conductive line currents, wherein "m" currents are generated by the binary weighted summation circuit, wherein magnitudes of the "m" currents represent a result a multiplication of the vector by the "n×m" matrix.

18. The non-volatile memory system of claim 17, wherein:
- each value in the "n×m" matrix represents a weight in an artificial neural network;
- the vector corresponds to a set of "n" input neurons in the artificial neural network; and
- the magnitudes of the "m" currents correspond to a set of "m" output neurons in the artificial neural network.

19. The non-volatile memory system of claim 17, wherein the binary weighted summation circuit comprises:
- "r" current mirrors for each of the "m" columns of nodes, each of the "r" current mirrors configured to receive the current from one of the second conductive lines associated with one of the "m" columns, each of the "r" current mirrors configured to multiply the current from its second conductive line by a different power of two; and
- for each of the "m" columns of nodes, a current mirror configured to sum the multiplied currents for the respective column.

20. A non-volatile memory system comprising:
"n" first conductive lines;
"n×m" nodes of non-volatile memory cells, each node comprises "r" memory cells, "m" nodes connected to each of the "n" first conductive lines, the "n×m" nodes of non-volatile memory cells forming an "n×m" array of nodes;
"m×r" second conductive lines, each second conductive line connected to one memory cell in "n" nodes that are connected to different first conductive lines, "n" nodes of memory cells connected to the same "r" second conductive lines, "n" nodes of memory cells connected to the same "r" second conductive lines forming a column of the "n×m" array of nodes;
write means for storing a weight into each of the "n×m" nodes of non-volatile memory cells, the write means for writing either a "1" or a "0" to each of the non-volatile memory cells, wherein the weights represent an "n×m" matrix of weights;
voltage generation means for generating "n" first voltages for the "n" first conductive lines and a second voltage for the "m×r" second conductive lines, wherein a difference between each of the "n" first voltages and the second voltage corresponds to "n" multiply voltages, wherein a magnitude of each multiply voltage represents a magnitude of one of "n" elements of a second vector;

voltage application means for simultaneously applying the "n" first voltages to corresponding ones of the "n" first conductive lines while applying the second voltage to the "m×r" second conductive lines, wherein each of the non-volatile memory cells passes a current to its associated second conductive line in response to the multiply voltage applied to that memory cell;

current multiplying means for multiplying, for each column of the "n×m" array of nodes, the current in each of the "r" second conductive lines associated with that column by a different power of two; and current summation means for summing, for each column of the "n×m" array of nodes, the multiplied "r" second conductive line currents for the respective column, wherein "m" currents are generated by the current summation means, wherein the "m" currents represent a result of multiplication of the vector by the "n×m" matrix of weights.

\* \* \* \* \*